United States Patent
Obenauf et al.

(10) Patent No.: US 11,813,884 B2
(45) Date of Patent: *Nov. 14, 2023

(54) LITHOGRAPHIC PRINTING PLATE PRECURSORS AND METHOD OF USE

(71) Applicant: Eastman Kodak Company, Rochester, NY (US)

(72) Inventors: Johannes Obenauf, Goslar (DE); Domenico Balbinot, Osterode (DE)

(73) Assignee: EASTMAN KODAK COMPANY, Rochester, NY (US)

( * ) Notice: Subject to any disclaimer, the term of this patent is extended or adjusted under 35 U.S.C. 154(b) by 372 days.

This patent is subject to a terminal disclaimer.

(21) Appl. No.: 17/189,497

(22) Filed: Mar. 2, 2021

(65) Prior Publication Data

US 2022/0194112 A1    Jun. 23, 2022

Related U.S. Application Data

(60) Provisional application No. 63/126,590, filed on Dec. 17, 2020.

(51) Int. Cl.
*B41N 1/08* (2006.01)
*B41N 3/03* (2006.01)
*G03F 7/027* (2006.01)
*B41M 1/06* (2006.01)

(52) U.S. Cl.
CPC ............... *B41N 1/083* (2013.01); *B41M 1/06* (2013.01); *B41N 3/034* (2013.01); *G03F 7/027* (2013.01)

(58) Field of Classification Search
CPC ...................................................... G03F 7/027
See application file for complete search history.

(56) References Cited

U.S. PATENT DOCUMENTS

| | | | |
|---|---|---|---|
| 4,566,952 A | 1/1986 | Sprintschnik et al. | |
| 8,783,179 B2 | 7/2014 | Kurokawa et al. | |
| 10,363,734 B2 | 7/2019 | Merka et al. | |
| 10,828,884 B2 * | 11/2020 | Merka | C25D 11/12 |
| 2011/0265673 A1 | 11/2011 | Tagawa et al. | |
| 2012/0070779 A1 | 3/2012 | Miyamoto et al. | |
| 2012/0192742 A1 | 8/2012 | Kurokawa et al. | |
| 2014/0047993 A1 | 2/2014 | Hauck et al. | |
| 2014/0326151 A1 | 11/2014 | Namba et al. | |
| 2015/0135979 A1 | 5/2015 | Tagawa et al. | |
| 2018/0250925 A1 | 9/2018 | Merka et al. | |
| 2019/0016110 A1 | 1/2019 | Merka et al. | |
| 2021/0094336 A1 | 4/2021 | Merka et al. | |

FOREIGN PATENT DOCUMENTS

| | | | |
|---|---|---|---|
| EP | 0 626 273 A1 | 11/1994 | |
| EP | 1 500 498 A2 | 1/2005 | |
| EP | 2353882 A1 | 8/2011 | |

* cited by examiner

*Primary Examiner* — Chanceity N Robinson
(74) *Attorney, Agent, or Firm* — J. Lanny Tucker

(57) ABSTRACT

Lithographic printing plate precursors have an aluminum-containing substrate prepared using two anodizing processes to provide an inner aluminum oxide layer of average dry thickness of 300-3,000 nm and a multiplicity of inner micropores of average inner micropore diameter of ≤100 nm. An outer aluminum oxide layer is provided with a multiplicity of outer micropores of average outer micropore diameter of 15-30 nm and a dry thickness of 30-650 nm. A hydrophilic layer is disposed on the outer aluminum oxide layer at 0.0002-0.1 $g/m^2$ and has a (1) compound having an ethylenically unsaturated polymerizable groups; a —OM group connected directly to a phosphorus atom, wherein M represents hydrogen, sodium, potassium, or aluminum; and (2) one or more hydrophilic polymers having (a) recurring units comprising an amide group, and (b) recurring units having an —OM' group that is directly connected to a phosphorus atom, wherein M' represents hydrogen, sodium, potassium, or aluminum.

20 Claims, No Drawings

LITHOGRAPHIC PRINTING PLATE PRECURSORS AND METHOD OF USE

FIELD OF THE INVENTION

This invention relates to lithographic printing plate precursors comprising an inventive aluminum-containing substrate that has been prepared using at least two separate anodizing processes to provide different aluminum oxide layers with different structural properties. The aluminum-containing substrate also has a unique hydrophilic layer disposed on the aluminum oxide layers, which comprising at least one unique hydrophilic copolymer as defined below; and a compound having a —OM group (as defined below) that is directly connected to a phosphorus atom and at least one ethylenically unsaturated polymerizable group. This invention also relates to a method for imaging and processing such lithographic printing plate precursors to provide lithographic printing plates. It further relates to a method of making such inventive precursors.

BACKGROUND OF THE INVENTION

In lithographic printing, lithographic ink receptive regions, known as image areas, are generated on a hydrophilic surface of a substrate. When the printing plate surface is moistened with water and a lithographic printing ink is applied, hydrophilic regions retain the water and repel the lithographic printing ink, and the lithographic ink receptive image regions accept the lithographic printing ink and repel the water. The lithographic printing ink is transferred from the lithographic printing plate to the surface of a material upon which the image is to be reproduced, perhaps with the use of a blanket roller.

Imagable elements or lithographic printing plate precursors used to prepare lithographic printing plates typically comprise one or more radiation-sensitive imageable layers disposed on the outermost hydrophilic surface of the substrate. Following imaging, either the exposed (imaged) regions or the non-exposed (non-imaged) regions of the one or more radiation-sensitive layers can be removed using a suitable developer, revealing the outermost hydrophilic surface of the substrate. If the exposed regions are removable, the lithographic printing plate precursor is considered positive-working. Conversely, if the non-exposed regions are removable, the lithographic printing precursor is considered negative-working.

Direct digital (laser) thermal imaging of lithographic printing plate precursors has become increasingly important in the printing industry in the last years because of their stability to ambient light. Such precursors have been designed to be sensitive to imaging near-infrared radiation of at least 750 nm. However, other very useful lithographic printing plate precursors are still designed to be sensitive to digital imaging with UV or "violet" radiation of at least 250 nm.

Negative-working lithographic printing plate precursors useful to prepare lithographic printing plates typically comprise a negative-working radiation-sensitive imageable layer disposed over the hydrophilic surface of a substrate. Radiation-sensitive photopolymerizable compositions used in negative-working lithographic printing plate precursors typically comprise free-radically polymerizable components, one or more radiation absorbers, an initiator composition, and optionally one or more polymeric binders that are different from the other noted components. Precursors of this type, having polymeric interlayers on the substrate and under the imageable layer(s), after being imaged, can be developed using conventional developers in an off-press development apparatus as described in U.S. Patent Application Publication 2012/0070779 (Miyamoto et al.)

In recent decades, there has been an emphasis in the industry for simplification of the lithographic printing plate making process, including an omission of the pre-development heating step (preheat) and carrying out development on-press (DOP) using a lithographic printing ink, fountain solution, or both, to remove unwanted (non-exposed) imageable layer materials on the lithographic printing plate precursors. Such negative-working lithographic printing plate precursors must be designed by balancing many features within the element structure in order to achieve optimal press life, on-press developability, and scratch resistance. It has not been an easy task to optimize all of these properties simultaneously because what chemical composition or structural feature may provide optimal level in one or two properties may cause a loss in another property.

Independently of the type of lithographic printing plate precursor, lithography has generally been carried out using a metal-containing substrate comprising aluminum or an aluminum-alloy of various metal compositions, for example containing a total of up to 10 weight % of one or more of other metals known in the art for this purpose. The raw stock aluminum-containing material can be cleaned in a "pre-etch" process using a base or surfactant solution to remove oil, grease, and other contaminants on the surface of the raw stock aluminum-containing material. The cleaned surface is then generally roughed by electrochemical or mechanical graining, followed by a "post-etch" treatment to remove any contaminants ("smut") formed during the graining process. Further industrial details of the preparation of useful substrates for lithographic printing plate precursors are found in U.S. Patent Application Publication 2014/0047993 A1 (Hauck et al.).

After further rinsing, the treated surface of the aluminum-containing substrate is then anodized one or more times to provide an outermost hydrophilic aluminum oxide coating for abrasion resistance and other needed properties of the resulting lithographic printing plate precursor once one or more imageable layers have been formed thereon.

One or more anodizing processes are used in some known methods of making precursor substrates, for example, as described in U.S. Pat. No. 4,566,952 (Sprintschnik et al.) and U.S. Pat. No. 8,783,179 (Kurokawa et al.), U.S. patent Application Publications 2011/0265673 (Tagawa et al.), 2012/0192742 (Kurokawa et al.), 2014/0326151 (Namba et al.), and 2015/0135979 (Tagawa et al.), and EP 2,353,882A1 (Tagawa et al.).

In these known methods of making precursor substrates, sulfuric acid, phosphoric acid, or both sulfuric acid and phosphoric acid have been used as electrolytes in combination with various process parameters in order to produce one or more anodic (aluminum oxide) layers of specific structures and thus achieve specific properties in the resulting precursors. However, it has been found that lithographic printing plate precursors prepared according to these known methods are still unsatisfactory in one or more properties such as scratch resistance, on-press developability, press life, and restart toning (RST).

Due to the detrimental effects of processing chemicals and waste generated during lithographic printing plate-making processes, lithographic printing plate precursors capable of being developed on press after imaging using lithographic inks and/or fountain solutions have become significantly more desirable in the industry. Early commercialized lithographic printing plate precursors of this type were typically limited to printing applications that require less than a hundred thousand impressions. Such a limitation was a result of a technical difficulty in achieving both fast on-press development and good image durability.

An advance in the art for on-press developable lithographic printing plate precursors is provided with the uniquely anodized substrates described in commonly assigned U.S. Pat. No. 10,828,884 (Merka et al.) and in commonly assigned U.S. Pat. No. 10,363,734 (Merka et al).

More recently, aluminum-containing substrates having multilayer anodic oxide structures such as those described in these publications were developed. Such substrates for on-press developable lithographic printing plate precursors with an on-press developable imageable layer exhibit image durability (good press life) while maintaining fast on-press developability. In such on-press developable lithographic printing plate precursors, a hydrophilic subbing layer can be positioned between the on-press developable imageable layer and the multi-layer aluminum anodic oxide structure.

A typical polymer to be included in this hydrophilic subbing layer is a partially neutralized polyacrylic acid. However, lithographic printing plates made from such on-press developable lithographic printing plate precursors have been shown to sometimes experience a problem known as poor re-start toning (identified as RST herein), in which the background becomes ink sensitive and needs many printed impressions to become clean when the lithographic printing operation is restarted after a printing interruption or stoppage.

Thus, there remains a need to provide lithographic printing plates that can be readily restarted after a printing interruption where the noted re-start toning problem is reduced or eliminated. It is particularly desirable that such lithographic printing plates be derived from on-press developable, negative-working lithographic printing plate precursors without sacrificing press life and on-press developability.

SUMMARY OF THE INVENTION

The present invention provides a lithographic printing plate precursor comprising:

a substrate having a surface, and an on-press developable radiation-sensitive imageable layer disposed over the surface of the substrate, wherein the substrate comprises:

an aluminum-containing plate having a grained and etched surface;

an inner aluminum oxide layer disposed on the grained and etched surface, the inner aluminum oxide layer having an average dry thickness ($T_i$) of at least 300 nm and up to and including 3,000 nm, and comprising a multiplicity of inner micropores having an average inner micropore diameter ($D_i$) of less than or equal to 100 nm;

an outer aluminum oxide layer disposed over the inner aluminum oxide layer, the outer aluminum oxide layer comprising a multiplicity of outer micropores having an average outer micropore diameter ($D_o$) of at least 15 nm and up to and including 30 nm, and having an average dry thickness ($T_o$) of at least 30 nm and up to and including 650 nm; and a hydrophilic layer disposed on the outer aluminum oxide layer at a dry coverage of at least 0.0002 g/m² and up to and including 0.1 g/m², and which hydrophilic layer comprises:

(1) a compound having one or more ethylenically unsaturated polymerizable groups, one or more —OM groups at least one of which is connected directly to a phosphorus atom, and a molecular weight of less than 2000 Daltons/mole, wherein M represents a hydrogen, sodium, potassium, or aluminum atom; and (2) one or more hydrophilic polymers, each of which comprising at least (a) recurring units comprising an amide group, and (b) recurring units comprising an —OM' group that is directly connected to a phosphorus atom, wherein M' represents a hydrogen, sodium, potassium, or aluminum atom.

Moreover, this invention provides a method for providing a lithographic printing plate, the method comprising:

imagewise exposing the lithographic printing plate precursor of any of the embodiments of the present invention to imaging radiation to form an imagewise exposed imageable layer having exposed regions and non-exposed regions, and removing the non-exposed regions from the imagewise exposed imageable layer, on-press, to form a lithographic printing plate.

Further, this invention provides a method for preparing a lithographic printing plate precursor, comprising, in order:

providing an aluminum-containing plate having an electrochemically or mechanically grained and etched surface;

subjecting the aluminum-containing plate to a first anodizing process to form an outer aluminum oxide layer on the electrochemically or mechanically grained and etched surface, the outer aluminum oxide layer comprising a multiplicity of outer micropores having an average outer micropore diameter ($D_o$) of at least 15 nm and up to and including 30 nm, and having an average dry thickness ($T_o$) of at least 30 nm and up to and including 650 nm;

rinsing the outer aluminum oxide layer;

subjecting the aluminum-containing plate to a second anodizing process to form an inner aluminum oxide layer underneath the outer aluminum oxide layer, the inner aluminum oxide layer having an average dry thickness ($T_i$) of at least nm and up to and including 3,000 nm; and comprising a multiplicity of inner micropores having an average inner micropore diameter ($D_i$) of less than or equal to 100 nm;

rinsing the outer aluminum oxide layer and the inner aluminum oxide layer;

forming an on-press developable radiation-sensitive imageable layer over the outer aluminum oxide layer; and after rinsing the outer aluminum oxide layer and the inner aluminum oxide layer, and before forming the on-press developable radiation-sensitive imageable layer over the outer aluminum oxide layer, providing a hydrophilic layer over the outer aluminum oxide layer, the hydrophilic layer comprising:

(1) a compound having one or more ethylenically unsaturated polymerizable groups, one or more —OM groups at least one of which is connected directly to a phosphorus atom, and a molecular weight of less than 2000 Daltons/mole, wherein M represents a hydrogen, sodium, potassium, or aluminum atom, and (2) one or more hydrophilic polymers, each of which comprising at least (a) recurring units comprising an amide unit, and (b) recurring units comprising an —OM' group that is directly connected to a phosphorus atom, wherein M' represents a hydrogen, sodium, potassium, or aluminum atom, and which hydrophilic layer is disposed over the outer aluminum oxide layer at a dry coverage of at least 0.0002 g/m² and up to and including 0.1 g/m².

The problem of re-start toning (RST) noted above has been successfully addressed by providing a unique hydrophilic layer (sometimes known as a "subbing" layer) on the multi-layer aluminum anodic oxide structure to form inventive on-press developable lithographic printing plate precursors. Such hydrophilic layer comprises (2) one or more hydrophilic polymers comprised of at least both (a) recurring units having an amide group, and (b) recurring units comprising an —OM' group that is directly connected to a phosphorus atom, wherein M' is a hydrogen, sodium, potassium, or aluminum atom. In addition, this hydrophilic layer comprises (1) a compound having one or more ethylenically unsaturated polymerizable groups, one or more —OM groups at least one of which is connected directly to a phosphorus atom, and a molecular weight of less than 2000 Daltons/mole, wherein M is a hydrogen, sodium, potassium, or aluminum atom. These two components of (1) the compound and (2) one or more hydrophilic polymers comprising at least one hydrophilic copolymer must be used together. Specific details of these essential components used to make the hydrophilic layer are provided below. The noted improvement in RST is achieved while maintaining acceptable scratch resistance, on-press developability, and long press life.

DETAILED DESCRIPTION OF THE INVENTION

The following discussion is directed to various embodiments of the present invention and while some embodiments can be desirable for specific uses, the disclosed embodiments should not be interpreted or otherwise considered to limit the scope of the present invention, as claimed below. In addition, one skilled in the art will understand that the following disclosure has broader application than is explicitly described in the discussion of any particular embodiment.

Definitions

As used herein to define various components of the radiation-sensitive imageable layer formulations (and resulting dried layers), anodizing solutions, hydrophilic layer formulations (and resulting dried layers), and other materials used in the practice of this invention, unless otherwise indicated, the singular forms "a," "an," and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term should be interpreted as having a standard dictionary meaning.

The use of numerical values in the various ranges specified herein, unless otherwise expressly indicated otherwise, are considered to be approximations as though the minimum and maximum values within the stated ranges were both preceded by the word "about." In this manner, slight variations above and below the stated ranges may be useful to achieve substantially the same results as the values within the ranges. In addition, the disclosure of these ranges is intended as a continuous range including every value between the minimum and maximum values as well as the end points of the ranges.

Unless the context indicates otherwise, when used herein, the terms "negative-working radiation-sensitive lithographic printing plate precursor," "precursor," "radiation-sensitive precursor," and "lithographic printing plate precursor" are meant to be references of certain embodiments of the present invention.

The term "support" is used herein to refer to an aluminum-containing or other metal-containing material (sheet, web, strip, sheet, foil, or other form) that can be then treated to prepare a "substrate" as described in more detail below.

Average outer micropore diameter ($D_o$) in nanometers (nm) can be determined from a top view SEM image at a magnification of at least 50,000× taken from the substrate surface before the application of the optional hydrophilic layer and the radiation-sensitive imageable layer or layers. It is also possible to determine the outer micropore diameter ($D_o$) of a lithographic printing plate precursor by striping the organic layers with appropriate solvents and optionally removing about 20 nm to 80 nm thick outer portion of the outer aluminum oxide layer using an appropriate technique such as argon ion beam sputtering before taking the top view of the SEM image. The average can be determined by reviewing over 200 outer micropores.

Average inner micropore diameter ($D_i$) can be determined from a cross-sectional view SEM image at a magnification of at least 50,000×. The cross-section can be generated by bending the lithographic printing plate precursor or its substrate after the imageable layers and the optional hydrophilic layer have been removed. During bending, cracks are formed in the aluminum oxide layer and new surfaces are formed usually at the weakest position, which is usually located at the thinnest walls between adjacent inner micropores. Therefore, the new surfaces of cracks provide cross-sectional views of many micropores. For the present invention, it is not necessary to determine the exact average inner micropore diameter ($D_i$) as long as at least 90% of revealed micropore cross-sections has a width below 15 nm.

Average dry thickness ($T_o$) of the outer anodizing layer and average dry thickness ($T_i$) of the inner anodizing layer, in nanometers (nm), each can be determined from the cross-section SEM images of at least 50,000× magnification. The cross-sections of the aluminum oxide layer can be revealed through the cracks formed by bending a lithographic printing plate precursor or its substrate. The cross-sections of the aluminum oxide layer can also be revealed by cutting a slot through the aluminum oxide layer by a focused ion beam (FIB), a technique well known in the art.

The outer anodizing layer micropore density ($C_o$), in micropores/$\mu m^2$, can be determined from the top view SEM pictures of at least 50,000× magnification by counting the number of micropores in a predetermined area of a square having an area of, for example 500 nm by 500 nm.

The porosity ($P_o$) of the outer aluminum oxide layer can be constrained by each of the following equations:

$$0.3 \leq P_o \leq 0.8 \text{ or}$$

$$0.3 \leq P_o \leq 0.6,$$

wherein $P_o$ is defined as $3.14(C_o)(D_o^2)/4,000,000$.

As used herein, the term "radiation absorber" refers to a compound or material that absorbs electromagnetic radiation in a defined region and typically refers to compounds or materials, or a mixture thereof, that have an absorption maximum in the region of at least 250 nm (UV and violet) and up to and including 1400 nm.

As used herein, the term "infrared region" refers to radiation having a wavelength of at least 750 nm and higher. In most instances, the term "infrared" is used to refer to the "near-infrared" region of the electromagnetic spectrum that is defined herein to be at least 750 nm and up to and including 1400 nm. Similarly, infrared radiation absorbers provide sensitivity in the infrared region.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

As used herein, the term "polymer" is used to describe compounds with relatively large molecular weights formed by linking together many small reacted monomers. As the polymer chain grows, it folds back on itself in a random fashion to form coiled structures. With the choice of solvents, a polymer can become insoluble as the chain length grows and become polymeric particles dispersed in the solvent medium. These particle dispersions can be very stable and useful in radiation-sensitive imageable layers described for use in the present invention. In this invention, unless indicated otherwise, the term "polymer" refers to a non-crosslinked material. Thus, crosslinked polymeric particles differ from the non-crosslinked polymeric particles in that the latter can be dissolved in certain organic solvents of good solvating property whereas the crosslinked polymeric particles may swell but do not dissolve in the organic solvent because the polymer chains are connected by strong covalent bonds.

The term "copolymer" refers to polymers composed of two or more different repeating or recurring units that are arranged along the copolymer backbone.

The term "polymer backbone" refers to the chain of atoms in a polymer to which one or more pendant groups can be attached. An example of such a polymer backbone is an "all carbon" backbone obtained from the polymerization of one or more ethylenically unsaturated polymerizable monomers. Some polymer backbones can comprise both carbon and heteroatoms if the polymer is formed using condensation polymerization reactions using suitable reactants.

Recurring units in polymeric binders described herein are generally derived from the corresponding ethylenically unsaturated polymerizable monomers (also identified as "monomers" herein) used in a polymerization process, which ethylenically unsaturated polymerizable monomers can be obtained from various commercial sources or prepared using known chemical synthetic methods. Recurring units derived from the same ethylenically unsaturated polymerizable monomer are by definition the same in composition and molecular weight, unless otherwise noted herein.

As used herein, the term "ethylenically unsaturated polymerizable monomer" refers to a compound comprising one or more ethylenically unsaturated (—C=C—) bonds that are polymerizable using free radical or acid-catalyzed polymerization reactions and conditions. It is not meant to refer to chemical compounds that have only unsaturated —C=C— bonds that are not polymerizable under these conditions.

Unless otherwise indicated, the term "weight %" refers to the amount of a component or material based on the total solids of a composition, formulation, or dry layer. Unless otherwise indicated, the percentages can be the same for either a dry layer or the total solids of the formulation or composition used to form that dry layer.

As used herein, the term "layer" or "coating" can consist of one disposed or applied layer or a combination of several sequentially disposed or applied layers. If a layer is considered radiation-sensitive and negative-working, it is both sensitive to suitable radiation (for example infrared radiation) and negative-working in the formation of lithographic printing plates.

Uses

The lithographic printing plate precursors of the present invention are useful for forming lithographic printing plates for lithographic printing, for example using a lithographic printing ink and fountain solution. These precursors are prepared with the structure and components described as follows. In addition, the lithographic printing plate precursors of the present invention are designed to be negative-working and on-press developable using the appropriate materials and manufacturing procedures described below to provide negative-working radiation-sensitive formulations and imageable layers.

In addition, the inventive precursors are designed to be on-press developable so that development of the imaged precursor can be achieved on-press for example, using a fountain solution, lithographic printing ink, or both a fountain solution and a lithographic printing ink. However, it is still possible for such precursors to be developed off-press using a suitable developer if the user so desires.

The present invention is also useful for manufacturing such lithographic printing plate precursors that can then be sold to customers for use in imaging and printing.

Inventive Substrate

The inventive substrates useful in the present invention are designed with critical features and properties in order to achieve the advantages described above.

A general description relating to the production of substrates useful for lithographic printing plate precursors can be found in U.S. Patent Application Publication 2014/0047993A1 (noted above) the disclosure of which is herein incorporated by reference for details not explicitly provided herein.

In general, the lithographic printing plate substrate can be derived from an aluminum or other metal material, such as an aluminum alloy containing up to 10% by weight of one or more elements including but not limited to, manganese, silicon, iron, titanium, copper, magnesium, chromium, zinc, bismuth, nickel, and zirconium. The aluminum- or aluminum alloy-containing support (or "plate" or "raw stock") can have any form from which it can be further processed, including sheets, continuous webs and coiled strips as long as it has at least one (substantially planar) surface that can be treated as described below to form a hydrophilic surface in the inventive substrates. It is also possible to use polymeric films or papers onto which pure aluminum- or aluminum alloy-containing layers are deposited or laminated.

The resulting substrate should be thick enough to mechanically withstand the conditions in a modern printing press, but thin enough to be installed on (or wrapped around) a printing cylinder of such a machine. Thus, the substrates should also have appropriate tensile strength, elasticity, crystallinity, and conductivity needed for lithographic printing. These properties can be achieved by standard methods such as heat treatments or cold and hot rolling typical for the fabrication of continuous lithographic support strips, webs, or coils. Dry thicknesses of the resulting inventive substrates are generally at least 100 μm and up to and including 600 μm.

The described aluminum-containing supports can be treated using typical lithographic printing plate precursor manufacturing processes, including pre-etch, water rinse, roughening, water rinse, post-etch, and final water rinse procedures, in combination with the first and second anodizing process described in more detail below.

The raw stock aluminum-containing support is typically subjected to a pre-etching step to remove oil, grease, and metallic and other contaminants at or near the support surface. As is known in the art, this pre-etching step can be carried using a sodium hydroxide or other aqueous alkaline solutions or even certain organic solvents at known concentrations, times, and temperatures. A separate or additional degreasing step can be carried out using an aqueous surfactant solution if desired. A skilled worker would be able to carry out routine experimentation to find the optimal pre-etching conditions (for example, optimal solution concentration, dwell time, and temperature).

Typically, after the pre-etching step, the etched support is "roughened" in a suitable manner such as by using a known electrochemical or mechanical roughening (or graining) process. In electrochemical graining treatments, the etched support can be processed with alternating electric current in a solution of 5 to 20 g/liter hydrochloric acid. It is also possible to use solutions of nitric acid (for example, at up to 2.5 weight %) or sulfuric acid or mixtures for this purpose. Such electrochemical graining solutions can also contain additives such as corrosion inhibitors and stabilizers, including but not limited to metal nitrates, metal chlorides, monoamines, diamines, aldehydes, phosphoric acid, chromic acid, boric acid, lactic acid, acetic acid, and oxalic acid. For example, electrochemical graining can be carried out using the processes described in U.S. Patent Application Publication 2008/0003411 (Hunter et al.), the disclosure of which is incorporated herein by reference. A skilled worker would be able to determine by routine experimentation the optimal conditions for either electrochemical or mechanical graining as such processes are well known in the art. Mechanical graining processes can be carried out for example with suitable brushes alone or in combination with a slurry of abrasive materials such as silica particles or alumina particles. Alternatively, a combination of mechanical and electrochemical graining processes can be used.

During roughening or graining, smut can form on the surface of the support and this smut can be removed in a post-etching step using a treatment with a highly acidic or highly alkaline solution, for example, to remove 0.01-5.0 g/m² of the support surface. For example, post-etching can be carried out using a solution of sodium hydroxide, trisodium phosphate, or sulfuric acid. The amount of post-etching can be controlled by setting dwell time, concentration, and temperature of the etching solution. A suitable amount of post-etching also depends on the amount of roughening and the amount of smut formed in that step. The post-etching treatment must be sufficient to remove the smut, but it should not destroy too much of the surface structures formed in the roughening step. Thus, there are many combinations of the parameters that a skilled artisan can consider during routine experimentation to find the optimum post-etching conditions.

The foregoing steps result in an electrochemically or mechanically grained (roughened) and etched surface in the aluminum-containing support.

The next steps carried out according to the present invention include at least a first anodizing process and a second anodizing process, both of which are essential to the present invention, to form outer and inner aluminum oxide layers, respectively. The method of the present invention does not require additional anodizing processes (that is, third or more anodizing processes) but one or more additional anodizing processes are possible and thus, optional. However, in many embodiments, the first and second anodizing processes described herein are the only anodizing processes.

The first and second anodizing processes can be generally carried out using sulfuric or phosphoric acid (electrolyte) solutions at a suitable time of at least 20° C. and up to and including 70° C. for at least 1 second and up to and including 250 seconds, sufficient to provide a total dry aluminum oxide coverage (total for both outer and inner aluminum oxide layers) of up to and including 4 g/m². The conditions are described as follows for both the first and second anodizing processes.

A suitable aluminum-containing plate having an electrochemically or mechanically grained and etched surface is subjected to a first anodizing process to form an outer aluminum oxide layer on that electrochemically or mechanically grained and etched surface. The first anodizing process can be carried out, for example, using an electrolyte composition containing at least 50 g/liter and up to and including 350 g/liter of phosphoric acid or at least 150 g/liter and up to and including 300 g/liter of sulfuric acid, and a suitable amount of aluminum, for example 5 g/liter. These solution amounts can be optimized as to type of acid, acid concentration, aluminum concentration, dwell time, and temperature in order to achieve the desired outer aluminum oxide layer properties as described herein. Representative details of such first anodizing process are illustrated in the working Examples described below. It is particularly useful to carry out the first anodizing process using phosphoric acid.

The resulting outer aluminum oxide layer comprises a multiplicity of outer micropores having an average outer micropore diameter ($D_o$) of at least nm and up to and including 30 nm. In addition, the average dry thickness ($T_o$) of the outer aluminum oxide layer can be at least 30 nm and up to and including nm, or can be more likely at least 130 nm or at least 150 nm and up to and including 400 nm. The micropore density ($C_o$) of the outer anodizing layer can be generally at least 500 micropores/μm² and up to and including 3,000 micropores/μm².

Moreover, the average outer micropore diameter ($D_o$) in nanometers and the micropore density ($C_o$) in micropores/μm² of the outer aluminum oxide layer can be further constrained or related according to each of the following equations:

$$0.3 \leq P_o \leq 0.8 \text{ or}$$

$$0.3 \leq P_o \leq 0.6,$$

wherein porosity $P_o$ is defined above.

Once the first anodizing process has been carried out for the desired time, the formed outer aluminum oxide layer can be rinsed, if desired, with a suitable solution such as water at a suitable temperature and time to remove residual acid and aluminum, and to stop the first anodizing process.

The second anodizing process is then carried out to form an inner aluminum oxide layer underneath the outer aluminum oxide layer, using a suitable electrolyte composition that can comprise at least 100 g/liter and up to and including 350 g/liter of sulfuric acid, or at least 50 g/liter and up to and including 350 g/liter of phosphoric acid, as well as a suitable amount of aluminum, for example 5 g/liter. These solution amounts can be optimized as to acid concentration, aluminum concentration, dwell time, and temperature in order to achieve the desired inner aluminum oxide layer properties as described herein. The details of such second anodizing process are illustrated in the working Examples described below.

The resulting inner aluminum oxide layer disposed on the grained and etched surface of the substrate comprises a multiplicity of inner micropores having an average inner micropore diameter ($D_i$) of less than or equal to 100 nm. In some embodiments, the average inner micropore diameter ($D_i$) is less than or equal to 15 nm. In such embodiments, the ratio of $D_o$ to $D_i$ can be greater than 1.1:1, or even greater than 1.5:1, and typically greater than 2:1. In other embodiments, the average inner micropore diameter ($D_i$) is greater than 30 nm and it is greater than the average outer micropore diameter ($D_o$). In these latter embodiments, the ratio of $D_i$ to $D_o$ can be greater than 1.1:1 or even greater than 1.5:1, and typically greater than 2:1. In addition, the average dry thickness ($T_i$) of the inner aluminum oxide layer can be at least 300 nm or at least 650 nm, and up to and including 1500 nm, or up to and including 3,000 nm.

In some embodiments, the outer aluminum oxide layer is disposed directly on the inner aluminum oxide layer, and the average micropore diameter ($D_i$) of the inner aluminum oxide layer is at least 20 nm and is greater than the average micropore diameter ($D_o$) of the outer aluminum oxide layer.

Once the second anodizing process is carried out for a desired time, both formed outer aluminum oxide layer and inner aluminum oxide layer can be rinsed, if desired, with a suitable solution such as water, at a suitable temperature and time to remove residual acid and aluminum, and to stop the second anodizing process.

In some embodiments of the present invention, the aluminum-containing support is subjected to an additional anodizing process using a suitable acid or mixture thereof for a suitable time and at a suitable temperature to provide a "middle aluminum oxide layer." This additional anodizing process is carried out after the first anodizing process and before the second anodizing process. Thus, the middle aluminum oxide layer is generally formed between the outer aluminum oxide layer and the later-formed inner aluminum oxide layer. In such embodiments, the formed middle aluminum oxide layer can have an average dry thickness ($T_m$) of at least 60 nm and up to and including 300 nm, and comprise a multiplicity of middle micropores having an average middle micropore diameter ($D_m$) of at least 20 nm and up to and including 60 nm.

In such embodiments, $D_m$ is greater than $D_o$ that is greater than $D_i$, and $T_o$ can be less than 150 nm.

After the formation of this middle aluminum oxide layer, the outer aluminum oxide layer and the middle aluminum oxide layer can be rinsed as described above for the outer aluminum oxide layer alone, and before the inner aluminum oxide layer is formed as noted above.

According to this invention it is essential to provide a hydrophilic layer disposed on the outer aluminum oxide layer. The hydrophilic layer can be provided from a hydrophilic layer formulation comprising one or more hydrophilic polymers, and is generally applied or disposed on the outer aluminum oxide layer to provide a dry coverage of the hydrophilic layer of at least 0.0002 g/m² and up to and including 0.1 g/m² or in an amount of at least 0.005 g/m² and up to and including 0.08 g/m². Generally, the hydrophilic layer is disposed directly on the outer aluminum oxide layer so there are no intermediate layers. Since the outer aluminum oxide layer comprises micropores, some of the hydrophilic layer can reside inside such outer micropores and in micropores below the outer aluminum oxide layer.

The hydrophilic layer used in the practice of this invention comprises two essential components, that is: (1) a compound is defined as follows as having one or more ethylenically unsaturated polymerizable groups, one or more —OM groups at least one of which is connected directly to a phosphorus atom, and a molecular weight of less than 2000 Daltons/mole or less than 1500 Daltons/mole, wherein M represents a hydrogen, sodium, potassium, or aluminum atom; and (2) one or more hydrophilic polymers, each of which comprises at least (a) recurring units comprising an amide group, and (b) recurring units comprising an —OM' group that is directly connected to a phosphorus atom, wherein M' is a hydrogen, sodium, potassium, or aluminum ion. M and M' can be the same or different atoms in a given hydrophilic layer formulation.

The essential (1) compound having one or more ethylenically unsaturated polymerizable groups is more particularly defined as follows. At least one of such ethylenically unsaturated polymerizable groups is connected to the phosphorus atom to which the —OM group is directly connected. Thus, the at least one ethylenically unsaturated group can be connected to that phosphorus atom directly or via a spacer group as noted below.

Such one or more ethylenically unsaturated polymerizable groups generally comprise a carbon-carbon double bond that is polymerizable in the presence of free radical or cationic initiators as one skilled in polymer chemistry would know. More particularly, such groups can be represented by the following formula:

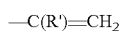

—C(R')=CH₂ wherein R' represents a hydrogen atom, or an unsubstituted linear or branched alkyl group having 1 to 4 carbon atoms, including but not limited to, unsubstituted methyl, ethyl, n-propyl, isobutyl, n-butyl, and t-butyl groups. In most embodiments R is a hydrogen atom or an unsubstituted methyl group.

The (1) compound also must comprise one or more (typically only one) —OM group wherein M represents a hydrogen, sodium, potassium, or aluminum atom. At least one of the one or more —OM groups must be connected directly to a phosphorus atom within the (1) compound molecule that can contain one or more such phosphorus atoms.

In addition, the (1) compound must have a molecular weight of less than 2000 Daltons/mole, or at least 150 Daltons/mole and up to and including Daltons/mole, or up to and including 1500 Daltons/mole.

Multiple (1) compounds can be present in the hydrophilic layer, and they can differ in chemical composition including but not limited to different M atoms, different molecular weights, or different numbers or compositions of ethylenically unsaturated groups (for example, different R groups), or combinations of these differences.

As noted above, in some embodiments, at least one ethylenically unsaturated polymerizable group in the (1) compound can be connected to a phosphorus atom in the molecule using a spacer group such as but not limited to, —(—CH₂CH₂O—)$_p$, wherein the subscript p is an integer of at least 1 and up to and including 10, but is likely at least 1 and up to and including 6.

For example, useful (1) compounds can be represented by the following Structure (I):

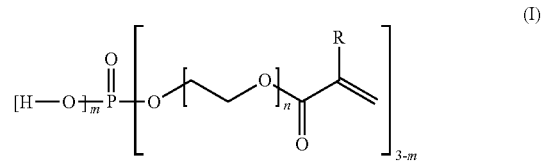

wherein the subscript m is 1 or 2 of the illustrated hydroxy groups, the subscript n is an integer of at least 1 and up to and including 10 for the illustrated ethyleneoxy groups, and R is a hydrogen atom or a substituted or unsubstituted methyl group. Mixtures of such (1) compounds having different R groups, a different number of hydroxy groups, or a different number of ethyleneoxy groups, can be used if desired.

One or more of the (1) compounds described herein are present in the hydrophilic layer disposed on the outer aluminum oxide layer in an amount of at least 10 weight %, or at least 20 weight %, and up to and including 60 weight %, or up to and including 80 weight %, based on the total weight of the hydrophilic layer.

In addition, the weight ratio of one or more (1) compounds to the (2) one or more hydrophilic polymers (described below) in the hydrophilic layer is from 1:4 to 4:1, or more likely from 1:3.5 to 2:3. Such weight ratios would generally be the same for the wet hydrophilic layer formulation.

Each of the essential (2) one or more hydrophilic polymers in the hydrophilic layer comprises (a) recurring units, each of which has at least one amide group and which can be derived from one or more corresponding ethylenically unsaturated polymerizable monomers having an amide group such as methacrylamide, acrylamide, N,N-dimethyl acrylamide, N-hydroxyethyl methacrylamide, and N-(methoxymethyl)acrylamide. Mixtures of two or more of these monomers can be used to provide a mixture of (a) recurring units of different composition or molecular weight, all having at least one amide group in the recurring unit. The amide groups in the monomers are not generally chemically reacted during the polymerization process to form the (a) recurring units in the hydrophilic copolymer.

Each (2) one or more hydrophilic polymers also comprises (b) recurring units, each of which (b) recurring units has an —OM' group that is directly attached to a phosphorus atom, wherein M' represents a hydrogen, sodium, potassium, or aluminum atom. The bond within the —OM' group can be covalent or ionic. The M' atom is typically a hydrogen, sodium, or potassium atom, and more typically it is a hydrogen atom when the hydrophilic copolymer is present in a hydrophilic layer formulation before it is applied to the surface of the multilayer aluminum oxide structure as described above. Upon application of the hydrophilic layer formulation, some of the hydrogen, sodium or potassium atoms are likely converted to aluminum ions, thereby facilitating bonding of the hydrophilic copolymer to the multilayer aluminum oxide structure.

Such (b) recurring units can be derived from suitable corresponding ethylenically unsaturated polymerizable monomers each having an —OM' group directly attached to a phosphorus atom, or the —OM' group can be formed after polymerization from a suitable "precursor group" such as an —OR' in a phosphate ester group, wherein R' is a substituted or unsubstituted alkyl group having 1 to 20 carbons. Such ethylenically unsaturated polymerizable monomers from which the (b) recurring units can be derived can have more than one such —OM' group at long as at least one such —OM' group is directly connected or attached to a phosphorus atom. Useful ethylenically unsaturated polymerizable monomers of this type include but are not limited to those represented by Structure (II).

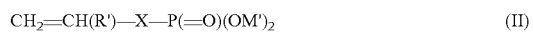

$$CH_2=CH(R')—X—P(=O)(OM')_2 \qquad (II)$$

wherein $R^1$ is hydrogen or a linear or branched alkyl group of 1 to 4 carbons, M' is independently a hydrogen, sodium, or potassium ion, and X is a single bond or a divalent linking group having a suitable number of linking carbon atoms or a combination of linking carbon and oxygen atoms. Useful divalent X groups include, but are not limited to, those represented by the following Structure (III).

$$—C(=O)—(OCH_2CH_2)_q—O— \qquad (III)$$

wherein the subscript q is an integer of 1 to 10.

Specific examples of useful ethylenically unsaturated polymerizable monomers according to Structure (II) include vinyl phosphonic acid, ethylene glycol acrylate phosphate, and ethylene glycol methacrylate phosphate. Mixtures of such ethylenically unsaturated polymerizable monomers can also be used to form the (b) recurring units so that the recurring units can have different chemical composition or molecular weight, as long as each (b) recurring unit has at least one —OM group attached to a phosphorus atom.

If mixtures of (2) hydrophilic polymers are present, they can have different (a) and (b) recurring unit compositions and/or different amounts of (a) and (b) recurring units, or different amounts of additional recurring units other than (a) and (b) recurring units as described below.

The (2) one or more hydrophilic polymers present in the hydrophilic layer each can comprise (a) recurring units in an amount of at least 60 mol % or at least 80 mol %, and up to and including 95 mol % or up to and including 97 mol %, all based on the total number (or moles) of recurring units in the particular hydrophilic polymer including the total of (a) recurring units, (b) recurring units, and any other recurring units that are not defined as (a) and (b) recurring units.

The (2) one or more hydrophilic polymers present in the hydrophilic layer can each comprise (b) recurring units in an amount of at least 3 mol % and up to and including 25 mol %, or up to and including 40 mol %, all based on the total number (or moles) of recurring units in the hydrophilic copolymer including the total of (a) recurring units, (b) recurring units, and any other recurring units that are not defined as (a) and (b) recurring units.

It is possible for the (2) one or more hydrophilic polymer to include up to and including 35 mol %, based on the total number (or moles) of recurring units, of recurring units that are not (a) recurring units or (b) recurring units. A skilled artisan would be able to determine suitable monomers useful for providing these optional recurring units. However, useful optional recurring units that are not (a) recurring units or (b) recurring units, can be recurring units comprising at least one carboxylic acid groups and such optional recurring units can be present typically in an amount of less than 30 mol %, and more typically at less than 20 mol %, all based on total number (or moles) of recurring units in the (2) one or more hydrophilic polymers. In some embodiments of the present invention, the (2) one or more hydrophilic polymers incorporated into the hydrophilic layer contain only (a) recurring units and (b) recurring units, as defined above.

Particularly useful (2) hydrophilic polymers comprise (a) recurring units that are derived at least in part from one or more of methacrylamide and acrylamide, and (b) recurring units that are derived from at least vinyl phosphonic acid. In some embodiments of this invention, the (2) hydrophilic polymers comprise only such (a) recurring units and (b) recurring units.

Mixtures of two or more of such (2) one or more hydrophilic polymers can be used in the hydrophilic layer in any suitable weight combination.

Ethylenically unsaturated polymerizable monomers useful to prepare the (2) one or more hydrophilic polymers can be obtained from various commercial sources or prepared using known ethylenically unsaturated polymerizable monomers and polymerization reaction conditions.

In addition, the hydrophilic layer can include one or more additional hydrophilic homopolymers or copolymers each of which is different in composition from the (2) one or more hydrophilic polymers described above having the (a) and (b) recurring units. Such additional hydrophilic polymers are known in the art and if present generally comprise less than 70 weight %, more typically less than 50 weight % an even more typically less than 30 weight %, of the total weight of the one or more (2) one or more hydrophilic polymers, and such additional hydrophilic polymers can be purchased from known commercial sources or prepared using known starting materials and procedures. The (2) one or more hydrophilic polymers, each having (a) recurring units and (b) recurring units as described above, comprises at least 20 weight % or at least 40 weight %, of the total weight of the hydrophilic layer, particularly after at least 95 weight % of the coating solvent(s) has been removed from the disposed hydrophilic layer formulation.

The amount of the (2) one or more hydrophilic polymers in the hydrophilic layer can be determined by reference to the amount of (1) compound used and the weight ratio described above.

The hydrophilic layer and the hydrophilic layer formulation can contain small amounts of additives such as inorganic acid (for example, phosphoric acid in an amount of at least 0.01 weight %), salts of inorganic acids, and surfactants, as would be readily known in the art. Particularly useful hydrophilic layer formulations and resulting hydrophilic layers are described below in relation to the working Examples.

The process used to form the hydrophilic layer can be carried out in any suitable manner as described for examples in [0058]-[0061] of U.S. Patent Application Publication 2014/0047993 (noted above), the disclosure of which is incorporated herein by reference. Alternatively, the post-treatment process can be carried out by coating a desired amount of the hydrophilic layer formulation in a suitable solvent such as water directly onto the outer aluminum oxide layer and then drying the resulting wet coating. It is expected that during or after formation of the hydrophilic layer, the —OM and —OM' groups that are attached to or directly connected to the phosphorus atom in the (1) compound and in recurring units (b) of the (2) one or more hydrophilic polymers are at least partially reacted with the surfaces of the multilayer aluminum oxide structure to form linkages of P—O—Al.

After all of these essential treatments, the resulting inventive substrates, in any suitable form such as flat sheets or continuous webs or coils, are ready for the preparation of lithographic printing plate precursors according to the present invention.

Radiation-Sensitive Imageable Layers and Precursors

One or more on-press developable radiation-sensitive imageable layers can be formed or disposed over the hydrophilic layer of the inventive substrate in a suitable manner using suitable on-press developable radiation-sensitive imageable layer formulations as described in more detail below. Such radiation-sensitive imageable layers are generally negative-working in chemical nature.

Negative-Working Lithographic Printing Plate Precursors:

The precursors of the present invention can be formed by suitable application of a negative-working on-press developable radiation-sensitive composition as described below to a suitable inventive substrate (as described above) to form a radiation-sensitive imageable layer that is negative-working on that substrate. In general, the negative-working radiation-sensitive composition (and resulting negative-working radiation-sensitive imageable layer) comprises (a) one or more free radically polymerizable components, (b) an initiator composition that provides free radicals upon exposure to imaging radiation (such as infrared radiation defined herein), and (c) one or more radiation absorbers (such as infrared radiation absorbers), as essential components, and optionally, a polymeric binder that is different from all of (a), (b), and (c), all of which essential and optional components are described in more detail below. There is generally only a single negative-working, on-press developable radiation-sensitive imageable layer in the precursor. It is generally the outermost layer in the precursor, but in some embodiments, there can be an outermost hydrophilic overcoat (also known as a topcoat or oxygen barrier layer) disposed over single negative-working on-press developable the radiation-sensitive imageable layer.

Thus, the components of the on-press developable radiation-sensitive imageable layer are designed in such a manner (types and forms of chemical compounds and amounts of each) that after imagewise exposure, the imaged precursor is on-press developable using a lithographic printing ink, a fountain solution, or a combination of a lithographic printing ink and a fountain solution. More details of on-press developability are described below.

The negative-working radiation-sensitive composition (and radiation-sensitive imageable layer prepared therefrom) comprises (a) one or more free radically polymerizable components, each of which contains one or more free radically polymerizable groups (and two or more of such groups in some embodiments) that can be polymerized using free radical initiation. In some embodiments, the radiation-sensitive imageable layer comprises two or more free radically polymerizable components having the same or different numbers of free radically polymerizable groups in each molecule.

Useful free radically polymerizable components can contain one or more free radical polymerizable monomers or oligomers having one or more addition polymerizable ethylenically unsaturated groups (for example, two or more of such groups). Similarly, crosslinkable polymers having such free radically polymerizable groups can also be used. Oligomers or prepolymers, such as urethane acrylates and methacrylates, epoxide acrylates and methacrylates, polyester acrylates and methacrylates, polyether acrylates and methacrylates, and unsaturated polyester resins can be used. In some embodiments, the free radically polymerizable component comprises carboxyl groups.

It is possible for one or more free radically polymerizable components to have large enough molecular weight to enhance the mechanical properties of the radiation-sensitive imageable layer and thus make the corresponding lithographic printing plate precursors suitable for transportation in typical packaging and for handling during normal pre-press operation. It is also possible for one or more free radically polymerizable components to be present in the radiation-sensitive layer as a particulate material, the components having a particle size of at least 10 nm and up to and including 800 nm. In such embodiments, a separate non-polymerizable or non-crosslinkable polymer binder (described below) is not necessary but may still be present.

Free radically polymerizable components include urea urethane (meth)acrylates or urethane (meth)acrylates having multiple (two or more) polymerizable groups. Mixtures of such compounds can be used, each compound having two or more unsaturated polymerizable groups, and some of the compounds having three, four, or more unsaturated polymerizable groups. For example, a free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Useful free radically polymerizable compounds include NK Ester A-DPH (dipentaerythritol hexaacrylate) that is available from Kowa American, and Sartomer 399 (dipentaerythritol pentaacrylate), Sartomer (di-trimethylolpropane tetraacrylate), Sartomer 295 (pentaerythritol tetraacrylate), and Sartomer 415 [ethoxylated (20)trimethylolpropane triacrylate] that are available from Sartomer Company, Inc.

Numerous other free radically polymerizable components are known in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, N.Y., 1992, pp. 399-440, and in "Polymer Imaging" by A. B. Cohen and P. Walker, in *Imaging Processes and Material*, J. M. Sturge et al. (Eds.), Van Nostrand Reinhold, N.Y., 1989, pp. 226-262. For example, useful free radically polymerizable components are also described in EP 1,182,033A1 (Fujimaki et al.), beginning with paragraph [0170], and in U.S. Pat. No. 6,309,792 (Hauck et al.), U.S. Pat. No. 6,569,603 (Furukawa), and U.S. Pat. No. 6,893,797 (Munnelly et al.) the disclosures of all of which are incorporated herein by reference. Other useful free radically polymerizable components include those described in U.S. Patent Application Publication 2009/0142695 (Baumann et al.), which free radically polymerizable components include 1H-tetrazole groups, the disclosure of which is incorporated herein by reference.

Useful free radically polymerizable components as described above can be readily obtained from various commercial sources or prepared using known starting materials and synthetic methods.

The (a) one or more free radically polymerizable components are generally present in a negative-working radiation-sensitive imageable layer in an amount of at least 10 weight % and up to and including 70 weight %, or typically of at least 20 weight % and up to and including 50 weight %, all based on the total dry weight of the negative-working radiation-sensitive imageable layer.

The on-press developable radiation-sensitive imageable layer used in the present invention also comprises (b) an initiator composition that provides free radicals in the presence of a suitable radiation absorber, upon exposure of the on-press developable radiation-sensitive imageable layer to suitable imaging radiation to initiate the polymerization of the one or more free radically polymerizable components. The initiator composition can be a single compound or a combination or system of a plurality of compounds.

Suitable initiator compositions include but are not limited to, aromatic sulfonylhalides; trihalogenoalkylsulfones; trihalogenoarylsulfones; imides (such as N-benzoyloxyphthalimide); diazosulfonates; 9,10-dihydroanthracene derivatives; N-aryl, S-aryl, or O-aryl polycarboxylic acids with at least 2 carboxy groups, of which at least one is bonded to the nitrogen, oxygen, or sulfur atom of the aryl moiety; oxime esters and oxime ethers; α-hydroxy- or α-amino-acetophenones; benzoin ethers and esters; peroxides; hydroperoxides; azo compounds; 2,4,5-triarylimidazoylyl dimers (such as "HABI's"); trihalomethyl substituted triazines; boron-containing compounds; organoborate salts such as those described in U.S. Pat. No. 6,562,543 (Ogata et al.), and onium salts.

Useful initiator compositions particularly for infrared radiation-sensitive compositions and imageable layers include but are not limited to, onium salts such as ammonium, iodonium, sulfonium, and phosphonium compounds that are described in detail in [0131] of U.S. Patent Application Publication 2014/0047993 (noted above), and references cited therein, the disclosures of which are incorporated herein by reference. Examples of the onium salts include triphenylsulfonium, diphenyliodonium, diphenyldiazonium, and derivatives obtained by introducing one or more substituents into the benzene ring of these compounds. Suitable substituents include but are not limited to, alkyl, alkoxy, alkoxycarbonyl, acyl, acyloxy, chloro, bromo, fluoro and nitro groups.

Examples of anions in the onium salts include but are not limited to, halogen anions, $ClO_4^-$, $PF_6^-$, $BF_4^-$, $SbF_6^-$, $CH_3SO_3^-$, $CF_3SO_3^-$, $C_6H_5SO_3^-$, $CH_3C_6H_4SO_3^-$, $HOC_6H_4SO_3^-$, $ClC_6H_4SO_3^-$, and a boron anion as described for example in U.S. Pat. No. 7,524,614 (Tao et al.), the disclosure of which is incorporated herein by reference.

An onium salt can be obtained by combining an onium salt having sulfonium or iodonium in the molecule with an onium salt in the molecule. The onium salt can be a polyvalent onium salt having at least two onium ion atoms in the molecule that are bonded through a covalent bond. Among polyvalent onium salts, those having at least two onium ion atoms in the molecule are useful and those having a sulfonium or iodonium cation in the molecule are particularly useful. Representative polyvalent onium salts are represented by the following Formulae (6) and (7):

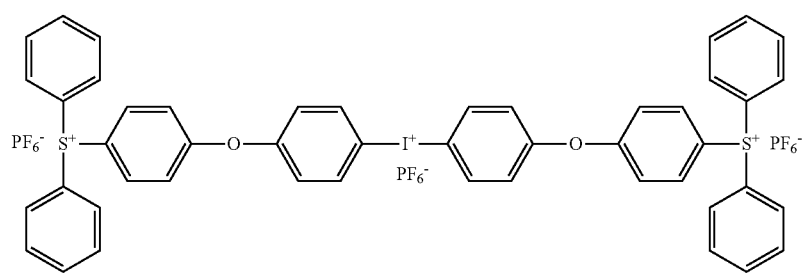

-continued

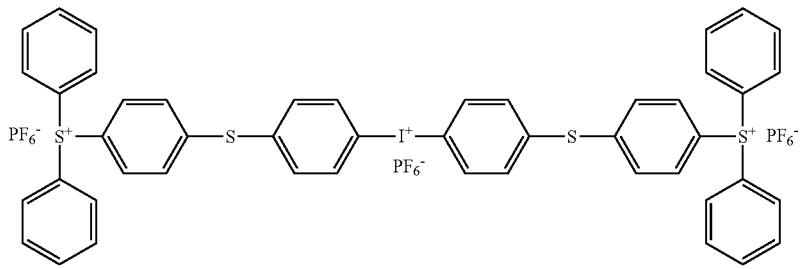

Furthermore, the onium salts described in paragraphs [0033] to [0038] of the specification of Japanese Patent Publication 2002-082429 [or U.S. Patent Application Publication 2002-0051934 (Ippei et al.), the disclosure of which is incorporated herein by reference] or the iodonium borate complexes described in U.S. Pat. No. 7,524,614 (noted above), can also be used in the present invention.

In some embodiments, the initiator composition can comprise a combination of initiator compounds such as a combination of iodonium salts, for example the combination of Compound A and Compound B described as follows.

Compound A can be represented by Structure (IV) shown below, and the one or more compounds collectively known as compound B can be represented below by either Structure (V) or (VI):

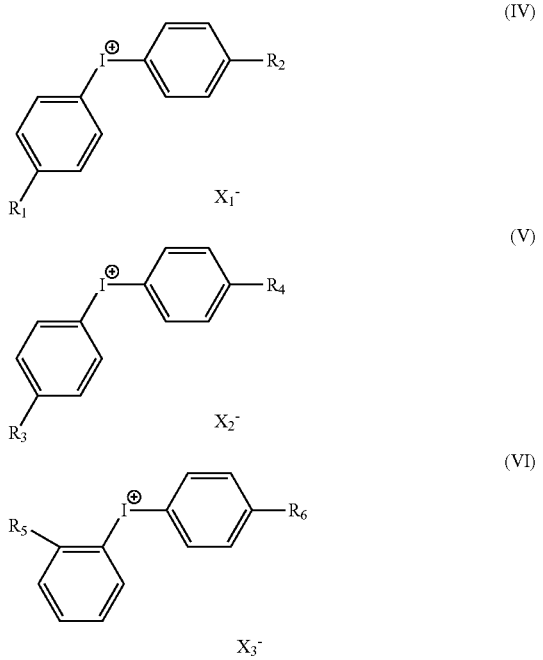

In these Structures (IV), (V), and (VI), $R_1$, $R_2$, $R_3$, $R_4$, $R_5$ and $R_6$ are independently substituted or unsubstituted alkyl groups or substituted or unsubstituted alkoxy groups, each of these alkyl or alkoxy groups having from 2 to 9 carbon atoms (or particularly from 3 to 6 carbon atoms). These substituted or unsubstituted alkyl and alkoxy groups can be in linear or branched form. In many useful embodiments, $R_1$, $R_2$, $R_3$, $R_4$, $R_5$ and $R_6$ are independently substituted or unsubstituted alkyl groups, such as independently chosen substituted or unsubstituted alkyl groups having 3 to 6 carbon atoms.

In addition, at least one of $R_3$ and $R_4$ can be different from $R_1$ or $R_2$; the difference between the total number of carbon atoms in $R_1$ and $R_2$ and the total number of carbon atoms in $R_3$ and $R_4$ is 0 to 4 (that is, 0, 1, 2, 3, or 4); the difference between the total number (sum) of carbon atoms in $R_1$ and $R_2$ and the total number (sum) of carbon atoms in $R_5$ and $R_6$ is 0 to 4 (that is, 0, 1, 2, 3, or 4); and $X_1$, $X_2$ and $X_3$ are the same or different anions.

Useful anions include but are not limited to, $ClO_4^-$, $PF_6^-$, $BF_4^-$, $SbF_6^-$, $CH_3SO_3^-$, $CF_3SO_3^-$, $C_6H_5SO_3^-$, $CH_3C_6H_4SO_3^-$, $HOC_6H_4SO_3^-$, $ClC_6H_4SO_3^-$, and borate anions represented by the following Structure (VII):

wherein $R_1$, $R^2$, $R^3$, and $R^4$ independently represent substituted or unsubstituted alkyl, substituted or unsubstituted aryl (including halogen-substituted aryl groups), substituted or unsubstituted alkenyl, substituted or unsubstituted alkynyl, substituted or unsubstituted cycloalkyl, or substituted or unsubstituted heterocyclic groups, or two or more of $R_1$, $R^2$, $R^3$, and $R^4$ can be joined together to form a substituted or unsubstituted heterocyclic ring with the boron atom, such rings having up to 7 carbon, nitrogen, oxygen, or nitrogen atoms. The optional substituents on $R_1$, $R^2$, $R^3$, and $R^4$ can include chloro, fluoro, nitro, alkyl, alkoxy, and acetoxy groups. In some embodiments, all of the $R_1$, $R^2$, $R^3$, and $R^4$ are the same or different substituted or unsubstituted aryl groups such as substituted or unsubstituted phenyl groups, or more likely all of these groups are unsubstituted phenyl groups. In many embodiments, at least one of $X_1$, $X_2$, and $X_3$ is a tetraarylborate anion comprising the same or different aryl groups, or in particularly useful embodiments, one or more is a tetraphenylborate anion or each of $X_1$, $X_2$, and $X_3$ is a tetraphenylborate anion.

Mixtures of Compound B compounds represented by Structures (V) or (VI) can be used if desired. Many useful compounds represented by Structures (IV), (V), and (VI) can be obtained from commercial sources such as Sigma-Aldrich or they can be prepared using known synthetic methods and readily available starting materials.

Components useful in the initiator compositions described above can be obtained from various commercial sources or prepared using known synthetic methods and starting materials.

The initiator composition is generally present in the on-press developable radiation-sensitive imageable layer sufficient to provide one or more polymerization initiators in an amount of at least 0.5 weight % and up to and including 20 weight %, or typically of at least 2 weight % and up to and including weight %, or even of at least 4 weight % and up to and including 12 weight %, all based on the total dry weight of the on-press developable radiation-sensitive imageable layer.

In addition, the on-press developable radiation-sensitive imageable layer also comprises (c) one or more radiation absorbers to provide desired radiation sensitivity or to convert radiation to heat, or both. In some embodiments, the on-press developable radiation-sensitive layer is sensitive to infrared radiation and comprises one or more different infrared radiation absorbers so that the lithographic printing plate precursors can be imaged with infrared radiation-emitting lasers, for example in response to digital information. The present invention is also applicable to lithographic printing plate precursors designed for imaging with violet lasers having emission peaks at around 405 nm, with visible lasers such as those having emission peaks around 488 nm or 532 nm, or with UV radiation having significant emission peaks below 400 nm. In such embodiments, the radiation absorbers can be selected to match the radiation source and many useful examples are known in the art, and are sometimes called "sensitizers". Useful radiation absorbers of this types are described for example, in Col. 11 (lines 10-43) of U.S. Pat. No. 7,285,372 (Baumann et al.), the disclosure of which is incorporated herein by reference.

In most embodiments of the present invention, the on-press developable negative-working radiation-sensitive imageable layer comprises one or more infrared radiation absorbers to provide desired infrared radiation sensitivity. Useful infrared radiation absorbers can be pigments or infrared radiation absorbing dyes. Suitable dyes also can be those described in for example, U.S. Pat. No. 5,208,135 (Patel et al.), U.S. Pat. No. 6,153,356 (Urano et al.), U.S. Pat. No. 6,309,792 (Hauck et al.), U.S. Pat. No. 6,569,603 (Furukawa), U.S. Pat. No. 6,797,449 (Nakamura et al.), U.S. Pat. No. 7,018,775 (Tao), U.S. Pat. No. 7,368,215 (Munnelly et al.), U.S. Pat. No. 8,632,941 (Balbinot et al.), and U.S. Patent Application Publication 2007/056457 (Iwai et al.), the disclosures of all of which are incorporated herein by reference. In some infrared radiation-sensitive embodiments, it is desirable that at least one infrared radiation absorber in the infrared radiation-sensitive imageable layer be a cyanine dye comprising a tetraarylborate anion such as a tetraphenylborate anion. Examples of such dyes include those described in United States Patent Application Publication 2011/003123 (Simpson et al.), the disclosure of which is incorporated herein by reference.

In addition to low molecular weight IR-absorbing dyes, IR dye chromophores bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Useful radiation absorbers described above can be readily obtained from various commercial sources or prepared using known starting materials and synthetic methods.

The total amount of one or more radiation absorbers in the on-press developable radiation-sensitive imageable layer is at least 0.5 weight % and up to and including 30 weight %, or typically of at least 1 weight % and up to and including 15 weight %, based on the total dry weight of the on-press developable radiation-sensitive imageable layer.

It is optional but desirable in many embodiments that the on-press developable radiation-sensitive imageable layer further comprise one or more (d) polymeric binders (or materials that act as polymeric binders) for all of the materials in the noted layer. Such polymer binders are different from all of the (a), (b), and (c) materials described above. These polymeric binders are generally non-crosslinkable and non-polymerizable.

Such (d) polymeric binders can be selected from a number of polymeric binder materials known in the art including polymers comprising recurring units having side chains comprising polyalkylene oxide segments such as those described in for example, U.S. Pat. No. 6,899,994 (Huang et al.) the disclosure of which is incorporated herein by reference. Other useful (d) polymeric binders comprise two or more types of recurring units having different side chains comprising polyalkylene oxide segments as described in for example WO Publication 2015-156065 (Kamiya et al.). Some of such (d) polymeric binders can further comprise recurring units having pendant cyano groups as those described in for example U.S. Pat. No. 7,261,998 (Hayashi et al.), the disclosure of which is incorporated herein by reference.

Some useful (d) polymeric binders can be present in particulate form, that is, in the form of discrete, non-agglomerated particles. Such discrete particles can have an average particle size of at least 10 nm and up to and including 1500 nm, or typically of at least 80 nm and up to and including 600 nm, and are generally distributed uniformly within the on-press developable radiation-sensitive imageable layer. For example, one or more useful (d) polymeric binders can be present in the form of particles having an average particle size of at least 50 nm and up to and including 400 nm. Average particle size can be determined by various known methods including measuring the particles in electron scanning microscope images, and averaging a set number of measurements.

In some embodiments, the (d) polymeric binder is present in the form of particles having an average particle size that is less than the average dry thickness (t) of the on-press developable radiation-sensitive imageable layer. The average dry thickness (t) in micrometers (μm) is calculated by the following Equation:

$$t = w/r$$

wherein w is the dry coating coverage of the on-press developable radiation-sensitive imageable layer in g/m$^2$ and r is 1 g/cm$^3$. For example, in such embodiments, the (d) polymeric binder can comprise at least 0.05% and up to and including 80%, or more likely at least 10% and up to and including 50%, of the on-press developable radiation-sensitive imageable layer.

The (d) polymeric binders also can have a backbone comprising multiple (at least two) urethane moieties as well as pendant groups comprising the polyalkylenes oxide segments.

Other useful (d) polymeric binders can comprise polymerizable groups such as acrylate ester, methacrylate ester, vinyl aryl, and allyl groups and as well as alkali soluble groups such as carboxylic acid. Some of these useful (d) polymeric binders are described in U.S. Patent Application Publication 2015/0099229 (Simpson et al.) and U.S. Pat. No. 6,916,595 (Fujimaki et al.), the disclosures of both of which are incorporated herein by reference.

Useful (d) polymeric binders generally have a weight average molecular weight (Mw) of at least 2,000 and up to and including 500,000, or at least 20,000 and up to and including 300,000, as determined by Gel Permeation Chromatography (polystyrene standard).

Useful (d) polymeric binders can be obtained from various commercial sources or they can be prepared using known procedures and starting materials, as described for example in publications described above.

The total (d) polymeric binders can be present in the on-press developable radiation-sensitive imageable layer in an amount of at least 10 weight % and up to and including 70 weight %, or more likely in an amount of at least 20 weight % and up to and including 50 weight %, based on the total dry weight of the on-press developable radiation-sensitive imageable layer.

Other polymeric materials known in the art (different from the (d) polymeric binders) can be present in the on-press developable radiation-sensitive imageable layer and such polymeric materials are generally more hydrophilic or more hydrophobic than the (d) polymeric binders described above. Examples of such hydrophilic polymeric binders include but are not limited to, cellulose derivatives such as hydroxypropyl cellulose, carboxymethyl cellulose, and polyvinyl alcohol with various degrees of saponification. More hydrophobic polymeric binders are less developable than the (d) polymeric binders described above and typically have an acid value less than 20 mg KOH/g for all acidic groups having a pKa below 7 and their corresponding salts. Such hydrophobic polymeric binders typically contain less than 10 weight %, more typically less than 5 weight %, segments that contribute to the hydrophilicity of the binder and are selected from the group consisting of hydroxyl group, —(CH$_2$CH$_2$—O)— and —C(=O)NHz. Examples of such hydrophobic polymeric binders include but are not limited to, poly(methyl methacrylate), poly(benzyl methacrylate), and polystyrene.

Additional optional additives to the on-press developable radiation-sensitive imageable layer can include organic dyes or organic dye precursors and color developers as are known in the art. Useful organic dyes or organic dye precursors include but are not limited to, phthalide and fluoran leuco dyes having a lactone skeleton with an acid dissociable lactone skeleton, such as those described in U.S. Pat. No. 6,858,374 (Yanaka), the disclosure of which is incorporated herein by reference. Such optional additives can be used as print-out colorants and can be present in an amount of at least 1 weight % and up to and including 10 weight %, based on the total dry weight of the on-press developable radiation-sensitive imageable layer. Other useful print-out colorants are known in the art and can include azo dyes, triarylmethane dyes, cyanine dyes, and spirolactone or spirolactam colorants as described for example in U.S. Patent Application Publication 2009/0047599 (Horne et al.).

The on-press developable radiation-sensitive imageable layer can include crosslinked polymer particles having an average particle size of at least 2 µm, or of at least 4 µm, and up to and including 20 µm as described for example in U.S. Pat. No. 8,383,319 (Huang et al.), U.S. Pat. No. 8,105,751 (Endo et al), and U.S. Pat. No. 9,366,962 (Kamiya et al.), the disclosures of all of which are incorporated herein by reference. Such crosslinked polymeric particles can be present only in the on-press developable radiation-sensitive imageable layer, only in the hydrophilic overcoat when present (described below), or in both the on-press developable radiation-sensitive imageable layer and the hydrophilic overcoat when present.

The on-press developable radiation-sensitive imageable layer can also include a variety of other optional addenda including but not limited to, dispersing agents, humectants, biocides, plasticizers, surfactants for coatability or other properties, viscosity builders, pH adjusters, drying agents, defoamers, preservatives, antioxidants, development aids, rheology modifiers, or combinations thereof, or any other addenda commonly used in the lithographic art, in conventional amounts. The on-press developable radiation-sensitive imageable layer can also include a phosphate (meth) acrylate having a molecular weight generally greater than 250 as described in U.S. Pat. No. 7,429,445 (Munnelly et al.) the disclosure of which is incorporated herein by reference.

Hydrophilic Overcoat:

While in some embodiments of the negative-working lithographic printing plate precursors, the on-press developable radiation-sensitive imageable layer is the outermost layer with no layers disposed thereon, it is possible that the precursors can be designed with a hydrophilic layer (also known in the art as a hydrophilic overcoat, oxygen-barrier layer, or topcoat) disposed over (or directly on) the on-press developable radiation-sensitive imageable layer (no intermediate layers between these two layers). When present, this hydrophilic overcoat is generally the outermost layer of the precursor.

Such hydrophilic overcoats can comprise one or more film-forming water-soluble polymeric binders in an amount of at least 60 weight % and up to and including 100 weight %, based on the total dry weight of the hydrophilic overcoat. Such film-forming water-soluble (or hydrophilic) polymeric binders can include a modified or unmodified poly(vinyl alcohol) having a saponification degree of at least 30%, or a degree of at least 75%, or a degree of at least 90%, and a degree of up to and including 99.9%.

Further, one or more acid-modified poly(vinyl alcohol)s can be used as film-forming water-soluble (or hydrophilic) polymeric binders in the hydrophilic overcoat. For example, at least one modified poly(vinyl alcohol) can be modified with an acid group selected from the group consisting of carboxylic acid, sulfonic acid, sulfuric acid ester, phosphonic acid, and phosphoric acid ester groups. Examples of such materials include but are not limited to, sulfonic acid-modified poly(vinyl alcohol), carboxylic acid-modified poly (vinyl alcohol), and quaternary ammonium salt-modified poly(vinyl alcohol), glycol-modified poly(vinyl alcohol), or combinations thereof.

The hydrophilic overcoat can also include crosslinked polymer particles having an average particle size of at least 2 µm and as described for example in U.S. Pat. No. 8,383, 319 (Huang et al.) and U.S. Pat. No. 8,105,751 (Endo et al), the disclosures of both of which are incorporated herein by reference.

The hydrophilic overcoat can be provided at a dry coating coverage of at least 0.1 g/m$^2$ and up to but less than 4 g/m$^2$, and typically at a dry coating coverage of at least 0.15 g/m$^2$ and up to and including 2.5 g/m$^2$. In some embodiments, the dry coating coverage is as low as 0.1 g/m$^2$ and up to and including 1.5 g/m$^2$ or at least 0.1 g/m$^2$ and up to and including 0.9 g/m$^2$, such that the hydrophilic overcoat is relatively thin.

The hydrophilic overcoat can optionally comprise organic wax particles dispersed within the one or more film-forming water-soluble (or hydrophilic) polymeric binders as described for example in U.S. Patent Application Publication 2013/0323643 (Balbinot et al.) the disclosure of which is incorporated herein by reference.

Making Lithographic Printing Plate Precursors

The radiation-sensitive lithographic printing plate precursors of the present invention can be provided in the following manner. A radiation-sensitive imageable layer formulation comprising materials described above (for either negative-working or positive-working chemistry) can be applied to the inventive substrate that is usually in a continuous substrate roll or web, as described above using any suitable equipment and procedure, such as spin coating, knife coating, gravure coating, die coating, slot coating, bar coating, wire rod coating, roller coating, or extrusion hopper coating. The radiation-sensitive imageable layer formulation can also be applied by spraying onto a suitable substrate. Typically, once the radiation-sensitive imageable layer formulation is applied at a suitable wet coverage, it is dried in a suitable manner known in the art to provide a desired dry coverage as noted below, thereby providing a radiation-sensitive continuous article that can be in any suitable form such as a web from which individual precursors can be prepared using known manufacturing processes.

The manufacturing methods typically include mixing the various components needed for a particular radiation-sensitive imageable layer chemistry in a suitable organic solvent or mixtures thereof [such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting radiation-sensitive imageable layer formulation to the continuous substrate web, and removing the solvent(s) by evaporation under suitable drying conditions. Further details of such manufacturing features are described in U.S. Patent Application Publication 2014/0047993 (noted above).

After proper drying, the dry coverage of the negative-working on-press developable radiation-sensitive imageable layer (especially those that are infrared radiation-sensitive) on an inventive substrate is generally at least 0.1 g/m$^2$ and up to and including 4 g/m$^2$ or at least 0.4 g/m$^2$ and up to and including 2 g/m$^2$ but other dry coverage amounts can be used if desired.

As described above, in some negative-working precursor embodiments, a suitable aqueous-based hydrophilic overcoat formulation can be applied to the dried on-press developable radiation-sensitive imageable layer using known coating and drying conditions, equipment, and procedures.

In practical manufacturing conditions, the result of these coating operations is a continuous web or roll of radiation-sensitive lithographic printing plate precursor material having an on-press developable radiation-sensitive imageable layer and any optional layers noted above disposed on the inventive substrate described above.

Individual rectangular lithographic printing plate precursors are formed from this resulting continuous radiation-sensitive web or roll by slitting to create multiple longitudinal strips, each of which has a width equal to one dimension of rectangular lithographic printing plate precursors. A cutting-to-length process is used to create a lateral cut across each strip at an interval equal to the other dimension of rectangular lithographic printing plate precursors, thereby forming individual precursors having a square or rectangular form.

Imaging (Exposing) Conditions

During use, a radiation-sensitive lithographic printing plate precursor of this invention can be exposed on-press to a suitable source of exposing radiation depending upon the radiation absorber (or sensitizer) present in the one or more radiation-sensitive imageable layers. For example, the negative-working lithographic printing plate precursors containing infrared radiation absorbers can be imaged with infrared lasers that emit significant radiation within the range of at least 750 nm and up to and including 1400 nm, or of at least 800 nm and up to and including 1250 nm. However, some on-press developable negative-working lithographic printing plate precursors can be imaged in the UV, "violet," or visible regions of the electromagnetic spectrum using suitable sources of imaging radiation (for example, from 250 nm and less than 750 nm). The result of such imagewise exposure is to provide exposed regions and non-exposed regions in the one or more on-press developable radiation-sensitive imageable layers.

Imaging can be carried out using imaging or exposing radiation from a radiation-generating laser (or array of such lasers). Imaging also can be carried out using imaging radiation at multiple wavelengths at the same time if desired, for example, using multiple infrared radiation wavelengths. The laser used to expose the precursor is usually a diode laser, because of the reliability and low maintenance of diode laser systems, but other lasers such as gas or solid-state lasers can also be used. The combination of power, intensity and exposure time for radiation imaging would be readily apparent to one skilled in the art.

The imaging apparatus can be configured as a flatbed recorder or as a drum recorder, with the radiation-sensitive lithographic printing plate precursor mounted to the interior or exterior cylindrical surface of the drum. An example of useful infrared imaging apparatus is available as models of KODAK® Trendsetter platesetters (Eastman Kodak Company) and NEC AMZISetter X-series (NEC Corporation, Japan) that contain laser diodes that emit radiation at a wavelength of about 830 nm. Other suitable infrared imaging apparatus includes the Screen PlateRite 4300 series or 8600 series platesetters (available from Screen USA, Chicago, Ill.) or thermal CTP platesetters from Panasonic Corporation (Japan) that operate at a wavelength of 810 nm.

Infrared radiation imaging energies can be at least 30 mJ/cm$^2$ and up to and including 500 mJ/cm$^2$ and typically at least 50 mJ/cm$^2$ and up to and including 300 mJ/cm$^2$ depending upon the sensitivity of the infrared radiation-sensitive imageable layer.

Useful UV and "violet" imaging apparatus include Prosetter (Heidelberger Druckmaschinen, Germany), Luxel V8N6 series (Fuji, Japan), Python (Highwater, UK), MakoNews, Mako 2, and Mako 8 (ECRM, US), Micro (Screen, Japan), Polaris and Advantage (AGFA, Belgium), LS Jet (Multiformat) and Smart 'n' Easy Jet (Krause, Germany), and VMAX series (DotLine, Germany), imagesetters.

Imaging in the UV to visible region of the electromagnetic spectrum and particularly the UV region (250 nm to 450 nm) can be carried out using energies of at least 0.01 mJ/cm$^2$ and up to and including 0.5 mJ/cm$^2$ at a power density of at least 0.5 kW/cm$^3$ and up to and including 50 kW/cm$^3$.

Processing (Development) and Printing

After imagewise exposing, the exposed negative-working on-press developable radiation-sensitive lithographic printing plate precursors having exposed regions and non-exposed regions in the on-press developable radiation-sensitive imageable layer can be processed in a suitable manner to remove the non-exposed regions and any hydrophilic overcoat if present, and leaving intact the hardened exposed regions.

For example, the negative-working lithographic printing plate precursors of the present invention are on-press developable using a lithographic printing ink, a fountain solution, or a combination of a lithographic printing ink and a fountain solution. In such embodiments, an imaged radiation-sensitive lithographic printing plate precursor according to the present invention can be mounted onto a printing press and the printing operation is then begun. The non-exposed regions in the radiation-sensitive imageable layer are removed by a suitable fountain solution, lithographic printing ink, or a combination of both, when the initial printed impressions are made. Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142W+Varn PAR (alcohol sub) (available from Varn International, Addison, Ill.).

In a typical printing press startup with a sheet-fed printing machine, the dampening roller is engaged first and supplies fountain solution to the mounted imaged precursor to swell the exposed radiation-sensitive imageable layer at least in the non-exposed regions. After a few revolutions, the inking rollers are engaged and they supply lithographic printing ink(s) to cover the entire printing surface of the lithographic printing plates. Typically, within 5 to 20 revolutions after the inking roller engagement, printing sheets are supplied to remove the non-exposed regions of the radiation-sensitive imageable layer from the lithographic printing plate as well as materials on a blanket cylinder if present, using the formed ink-fountain solution emulsion.

The present invention provides at least the following embodiments, individually or in any suitable combination:

1. A lithographic printing plate precursor comprising:
a substrate having a surface, and
an on-press developable radiation-sensitive imageable layer disposed over the surface of the substrate,
wherein the substrate comprises:
an aluminum-containing plate having a grained and etched surface;
an inner aluminum oxide layer disposed on the grained and etched surface, the inner aluminum oxide layer having an average dry thickness ($T_i$) of at least 300 nm and up to and including 3,000 nm, and comprising a multiplicity of inner micropores having an average inner micropore diameter ($D_i$) of less than or equal to 100 nm;
an outer aluminum oxide layer disposed over the inner aluminum oxide layer, the outer aluminum oxide layer comprising a multiplicity of outer micropores having an average outer micropore diameter ($D_o$) of at least 15 nm and up to and including 30 nm, and having an average dry thickness ($T_o$) of at least 30 nm and up to and including 650 nm; and
a hydrophilic layer disposed on the outer aluminum oxide layer at a dry coverage of at least 0.0002 g/m² and up to and including 0.1 g/m², and which hydrophilic layer comprises:
(1) a compound having one or more ethylenically unsaturated polymerizable groups, one or more —OM groups at least one of which is connected directly to a phosphorus atom, and a molecular weight of less than 2000 Daltons/mole, wherein M represents a hydrogen, sodium, potassium, or aluminum atom; and
(2) one or more hydrophilic polymers, each comprising at least (a) recurring units comprising an amide group, and (b) recurring units comprising an —OM' group that is directly connected to a phosphorus atom, wherein M' represents a hydrogen, sodium, potassium, or aluminum atom.

2. The lithographic printing plate precursor of embodiment 1, wherein the hydrophilic layer is disposed on the outer aluminum oxide layer at a dry coverage of at least 0.005 g/m² and up to and including 0.08 g/m².

3. The lithographic printing plate precursor of embodiment 1 or 2, wherein the outer aluminum oxide layer has a micropore density ($C_o$) of at least 500 micropores/μm² and up to and including 3,000 micropores/μm², and has a porosity ($P_o$) greater than or equal to 0.3 and less than or equal to 0.8 wherein Po is defined as $3.14(C_o)(D_o^2)/4,000,000$.

4. The lithographic printing plate precursor of any of embodiments 1 to 3, wherein the outer aluminum oxide layer has a micropore density ($C_o$) of at least 500 micropores/μm² and up to and including 3,000 micropores/μm², and has a porosity ($P_o$) greater than or equal to 0.3 and less than or equal to 0.5 wherein $P_o$ is defined as $3.14(C_o)(D_o^2)/4,000,000$.

5. The lithographic printing plate precursor of any of embodiments 1 to 4, wherein the outer aluminum oxide layer has an average dry thickness ($T_o$) of at least 130 nm, and the outer aluminum oxide layer is disposed directly on the inner aluminum oxide layer; the average dry thickness of the inner aluminum oxide layer ($T_i$) is at least 650 nm, and the average inner micropore diameter ($D_i$) is less than or equal to 15 nm and less than the average outer micropore diameter ($D_o$).

6. The lithographic printing plate precursor of any of embodiments 1 to 5, wherein the ratio of $D_o$ to $D_i$ is greater than 1.1:1.

7. The lithographic printing plate precursor of any of embodiments 1 to 6, wherein $T_i$ is at least 650 nm and up to and including 1500 nm.

8. The lithographic printing plate precursor of any of embodiments 1 to 7, wherein the substrate further comprises a middle aluminum oxide layer disposed between the inner aluminum oxide layer and the outer aluminum oxide layer, wherein the middle aluminum oxide layer has an average dry thickness ($T_m$) of at least 60 nm and up to and including 300 nm, and comprises a multiplicity of middle micropores having an average middle micropore diameter ($D_m$) of at least 20 nm and up to and including 60 nm, wherein $D_m$ is greater than $D_o$ that is greater than $D_i$, and the average dry thickness of the outer aluminum oxide layer ($T_o$) is less than 150 nm.

9. The lithographic printing plate precursor of embodiments 1 to 8, wherein the outer aluminum oxide layer is disposed directly on the inner aluminum oxide layer, and the average micropore diameter ($D_i$) of the inner aluminum oxide layer is at least 20 nm and is greater than the average micropore diameter ($D_o$) of the outer aluminum oxide layer.

10. The lithographic printing plate precursor of any of embodiments 1 to 9, wherein at least one ethylenically unsaturated polymerizable group in (1) compound is connected to the phosphorus atom to which the —OM group is connected, wherein the spacer group is represented by the formula —(—CH₂CH₂O—)$_p$— wherein the subscript p is an integer of at least 1 and up to and including 10.

11. The lithographic printing plate precursor of any of embodiments 1 to 10, wherein the (1) compound has a molecular weight of at least 100 Daltons/mole and up to and including 1500 Daltons/mole.

12. The lithographic printing plate precursor of any of embodiments 1 to 11, wherein the (1) compound has at least one ethylenically unsaturated polymerizable group represented by the formula:

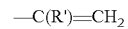

wherein R' represents a hydrogen atom or an unsubstituted linear or branched alkyl group having 1 to 4 carbon atoms.

13. The lithographic printing plate precursor of embodiment 12, wherein R is a hydrogen atom or an unsubstituted methyl group.

14. The lithographic printing plate precursor of any of embodiments 1 to 13, wherein the (1) compound is present in an amount of at least 10 weight % and up to and including 80 weight %, based on the total weight (solids) of the hydrophilic layer, or the weight ratio of one or more (1)

compounds to the (2) one or more hydrophilic polymers in the hydrophilic layer is from 1:4 to 4:1.

15. The lithographic printing plate precursor of any of embodiments 1 to 14, wherein the (1) compound is present in an amount of at least 10 weight % and up to and including 80 weight %, based on the total weight (solids) of the hydrophilic layer, or the weight ratio of one or more (1) compounds to the (2) one or more hydrophilic polymers in the hydrophilic layer is from 1:3.5 to 2:3.

16. The lithographic printing plate precursor of any of embodiments 1 to 15, wherein the (1) compound is represented by the following Structure (I)

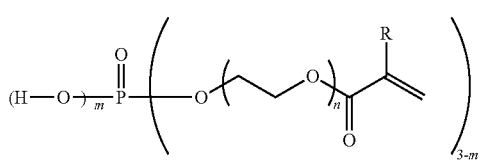

wherein the subscript m is 1 or 2, the subscript n is an integer of at least 1 and up to and including 10, and R is a hydrogen atom or a substituted or unsubstituted methyl group.

17. The lithographic printing plate precursor of any of embodiments 1 to 16, wherein the (a) recurring units are present in the (2) hydrophilic polymer in an amount of at least 60 mol % and up to and including 97 mol %, and the (b) recurring units are present in the (2) hydrophilic polymer in an amount of at least 3 mol % and up to and including 40 mol %, all based on the total number (or moles) of recurring units in the (2) one or more hydrophilic polymers.

18. The lithographic printing plate of any of embodiments 1 to 17, wherein the (a) recurring units are derived from one or more of methacrylamide, acrylamide, N,N-dimethyl acrylamide, N-hydroxyethyl methacrylamide, and N-(methoxymethyl)acrylamide.

19. The lithographic printing plate of any of embodiments 1 to 18, wherein the (b) recurring units are derived from one or more of ethylenically unsaturated polymerizable monomers represented by the following Structure (II).

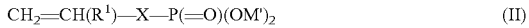

wherein $R^1$ is a hydrogen atom or a linear or branched alkyl group of 1 to 4 carbons, M' is independently a hydrogen, sodium, or potassium ion, and X is a single bond or a divalent linking group having a suitable number of linking carbon atoms or a combination of linking carbon and oxygen atoms.

20. The lithographic printing plate precursor of embodiment 19, wherein the X divalent group is represented by the following Structure (III).

wherein the subscript q is an integer of 1 to 10.

21. The lithographic printing plate precursor of any of embodiments 1 to 20, wherein the on-press developable radiation-sensitive imageable layer is negative-working and comprises:
(a) one or more free radically polymerizable components;
(b) an initiator composition that provides free radicals upon exposure of the radiation-sensitive imageable layer to imaging radiation;
(c) one or more radiation absorbers; and optionally,
(d) a polymeric binder that is different from all of (a), (b), and (c).

22. The lithographic printing plate precursor of any of embodiments 1 to 21, wherein the (2) one or more hydrophilic copolymers in the hydrophilic layer comprises the (a) recurring units that are derived at least from one or more of methacrylamide and acrylamide, or the (b) recurring units that are derived from at least vinyl phosphonic acid.

23. The lithographic printing plate precursor of any of embodiments 1 to 22, wherein the on-press developable radiation-sensitive imageable layer is negative-working and sensitive to infrared radiation, and comprises one or more infrared radiation absorbers.

24. The lithographic printing plate precursor of any of embodiments 21 to 23, wherein the on-press developable negative-working radiation-sensitive layer further comprises the (d) polymeric binder that is in particulate form.

25. A method for providing a lithographic printing plate, comprising:
imagewise exposing the lithographic printing plate precursor of any of embodiments 1 to 24 to imaging radiation to form an imagewise exposed imageable layer having exposed regions and non-exposed regions, and
removing the non-exposed regions from the imagewise exposed imageable layer, on press, to form a lithographic printing plate.

26. The method of embodiment 25, wherein the lithographic printing plate precursor comprises one or more infrared radiation absorbers, and the imagewise exposing is carried out using infrared radiation.

27. A method for preparing a lithographic printing plate precursor of any of embodiments 1 to 24, comprising, in order:
providing an aluminum-containing plate having an electrochemically or mechanically grained and etched surface;
subjecting the aluminum-containing plate to a first anodizing process to form an outer aluminum oxide layer on the electrochemically or mechanically grained and etched surface, the outer aluminum oxide layer comprising a multiplicity of outer micropores having an average outer micropore diameter ($D_o$) of at least 15 nm and up to and including 30 nm, and having an average dry thickness ($T_o$) of at least 30 nm and up to and including 650 nm;
rinsing the outer aluminum oxide layer;
subjecting the aluminum-containing plate to a second anodizing process to form an inner aluminum oxide layer underneath the outer aluminum oxide layer, the inner aluminum oxide layer having an average dry thickness ($T_i$) of at least 300 nm and up to and including 3,000 nm; and comprising a multiplicity of inner micropores having an average inner micropore diameter ($D_i$) of less than or equal to 100 nm;
rinsing the outer aluminum oxide layer and the inner aluminum oxide layer;
forming an on-press developable radiation-sensitive imageable layer over the outer aluminum oxide layer; and
after rinsing the outer aluminum oxide layer and the inner aluminum oxide layer, and before forming the on-press developable radiation-sensitive imageable layer over the outer aluminum oxide layer, providing a hydrophilic layer over the outer aluminum oxide layer, the hydrophilic layer comprising:
(1) a compound having one or more ethylenically unsaturated polymerizable groups, one or more —OM groups at least one of which is connected directly to a phosphorus atom, and a molecular weight of less than 2000 Daltons/mole, wherein M represents a hydrogen, sodium potassium, or aluminum atom, and (2) one or more hydrophilic polymers, each comprising at least (a) recurring units comprising an amide unit, and (b) recurring units comprising an —OM' group that is directly connected to a phosphorus atom, wherein M' represents a hydrogen, sodium, potassium, or aluminum atom, and which hydrophilic layer is disposed over the outer aluminum oxide layer at a dry coverage of at least 0.0002 g/m² and up to and including 0.1 g/m².

The following Examples are provided to illustrate the practice of this invention and are not meant to be limiting in any manner.

Invention Examples 1-3 and Comparative Examples 1-8

Aluminum-containing substrates A and B used to prepare the negative-working lithographic printing plate precursors of the Invention Examples and Comparative Examples were prepared according to the general processes described above.

Type 1 Support:

This aluminum-containing support was used to prepare the precursors of Invention Examples 1, 2, and 5-7 and Comparative Example 1-5. Hydro 1052 aluminum alloy strip or web (available from Norsk Hydro ASA, Norway) having a thickness of 0.28 mm was used as the aluminum-containing "plate" stock or support. Both pre-etch and post-etch steps were carried out in alkaline solutions under known conditions. Roughening (or graining) of these etched aluminum supports was carried out by electrochemical means in a hydrochloric acid solution at about 23° C. to obtain an arithmetic average roughness (Ra) of 0.5 µm on a surface of the aluminum-containing support. Thereafter, the aluminum-containing supports were subjected to two individual anodizing treatments as described in U.S. Pat. No. 10,828,884 (noted above), the disclosure of which is incorporated herein by reference. The first anodizing process was carried out using phosphoric acid as the electrolyte to form an outer aluminum oxide layer with an average micropore diameter ($D_o$) of 19 nm and an average dry thickness ($T_o$) of 190 nm. A second anodizing process was then carried out using sulfuric acid as the electrolyte to form an inner aluminum oxide layer with an average micropore diameter ($D_i$) of <10 nm and an average dry thickness ($T_i$) of 800 nm. These two anodizing steps were carried out in a continuous process on a typical manufacturing line used to manufacture lithographic printing plate precursors.

Type 2 Support:

This support was used to prepare the precursor of Invention Example 3. Hydro 1052 aluminum alloy strip or web (available from Norsk Hydro ASA, Norway) having a thickness of 0.28 mm was used as the aluminum-containing "plate" stock or support. Both pre-etch and post-etch steps were carried out in alkaline solutions under known conditions. Roughening (or graining) of the etched aluminum support was carried out by electrochemical means in a hydrochloric acid solution at about 23° C. to obtain an arithmetic average roughness (Ra) of 0.5 µm on a surface of the aluminum-containing support. Thereafter, the aluminum-containing substrates were subjected to two individual anodizing treatments. The first anodizing process was carried out using phosphoric acid as the electrolyte to form an outer aluminum oxide layer with an average micropore diameter ($D_o$) of 19 nm and an average dry thickness ($T_o$) of 60 nm. The second anodizing process was then carried out using phosphoric acid as the electrolyte to form an inner aluminum oxide layer with an average micropore diameter ($D_i$) of 70 nm and an average dry thickness ($T_i$) of 500 nm. These two anodizing steps were carried out in a continuous process on a typical manufacturing line used to manufacture lithographic printing plate precursors.

Type 3 Support:

This support was used to prepare the precursor of Invention Example 4. Hydro 1052 aluminum alloy strip or web (available from Norsk Hydro ASA, Norway) having a thickness of 0.28 mm was used as the aluminum-containing "plate" stock or support. Both pre-etch and post-etch steps were carried out in alkaline solutions under known conditions. Roughening (or graining) of the etched aluminum support was carried out by electrochemical means in a hydrochloric acid solution at about 23° C. to obtain an arithmetic average roughness (Ra) of 0.5 µm on a surface of the aluminum-containing support. Thereafter, the aluminum-containing substrates were subjected to two individual anodizing treatments as described in commonly assigned U.S. Pat. No. 10,828,884 (Merka et al.) and commonly assigned U.S. Pat. No. 11,117,412 (Merka, Mueller, Kemmling, and Blum), the disclosures of both of which are incorporated herein by reference. The first anodizing process was carried out using phosphoric acid as the electrolyte to form an outer aluminum oxide layer with an average micropore diameter ($D_o$) of 19 nm and an average dry thickness ($T_o$) of 60 nm. The second anodizing process was then carried out using phosphoric acid as the electrolyte to form a middle aluminum oxide layer with an average micropore diameter ($D_m$) of 23 nm and an average dry thickness ($T_m$) of 160 nm. A third anodizing process was carried out using sulfuric acid as the electrolyte to form an inner aluminum oxide layer with an average micropore diameter ($D_i$) of <10 nm and an average dry thickness ($D_i$) of 800 nm. These three anodizing steps were carried out in a continuous process on a typical manufacturing line used to manufacture lithographic printing plate precursors.

Preparation of Hydrophilic Layer Formulations

Hydrophilic Layer Formulations HL-1 to HL-10 that are evaluated below were prepared having the materials and amounts shown in the following TABLES I and II.

TABLE I

Hydrophilic Layer Formulations**

| | Hydrophilic Polymer | Hydrophilic Polymers Amount (g) | Non-polymeric Compound* | Non-polymeric Compound Amount (g) |
|---|---|---|---|---|
| HL-1 | 1 | 0.3237 | 2 | 0.0971 |
| HL-2 | 1 | 0.2525 | 2 | 0.1683 |
| HL-3 | 3 | 0.3237 | 2 | 0.0971 |
| HL-4 | 4 | 0.3237 | 2 | 0.0971 |
| HL-5 | 5 | 0.3237 | 2 | 0.0971 |
| HL-6 | 6 | 0.4209 | None | 0 |
| HL-7 | 6 | 0.3237 | 7 | 0.9711 |
| HL-8 | 8 | 0.3237 | 2 | 0.0971 |
| HL-9 | None | 0 | 2 | 0.4209 |
| HL-10 | 8 | 0.4209 | None | 0 |
| HL-11 | 1 | 0.4209 | None | 0 |
| HL-12 | 4 | 0.4209 | None | 0 |
| HL-13 | 5 | 0.4209 | None | 0 |

*Compounds that can include inventive (1) compounds having ethylenically unsaturated polymerizable groups.
**Each of the hydrophilic layer formulations contained 0.0291 g of Surfactant 10G, a nonionic surfactant available from DIXIE CHEMICAL COMPANY, INC (Houston, TX) and deionized water to make a total of 100 g hydrophilic layer formulation.

TABLE II

| | Materials identified in TABLE I |
|---|---|
| 1 | Copolymer derived from acrylamide and vinyl phosphonic acid (90:10 molar ratio) was prepared according to Synthesis Example1 of U.S. Patent Application Publication 2012/0070779(Miyamoto et al.), the disclosure of which is incorporated herein by reference |
| 2 | Poly(hema-phosphate) was obtained from Solvay S.A. Belgium |
| 3 | Copolymer derived from vinyl phosphonic acid, methacrylic acid and acrylamide (30:35:35 molar ratio) was prepared in ethanol with V59 (available from Wako Specialty Chemicals) as initiator using a procedure similar to Synthesis Example 1 of U.S. Patent Application Publication 2012/0070779 (noted above). |
| 4 | Copolymer derived from acrylamide and 2-(methacryloxy)ethyl phosphate (90:10 molar ratio) was prepared in ethanol with V59 as initiator |
| 5 | Copolymer derived methacrylamide and 2-(methacryloxy)ethyl phosphate (90:10 molar ratio) was prepared according to standard literature methods in ethanol with V59 as initiator (available from Wako Specialty Chemicals) as initiator using a procedure similar to Synthesis Example 1 of U.S. Patent Application Publication 2012/0070779 (noted above). |
| 6 | Polyacrylic acid was obtained from Sigma Aldrich |
| 7 | Phosphoric acid (10% aqueous solution) was obtained from Sigma Aldrich |
| 8 | Poly(vinyl phosphonic acid) was obtained from Merck Performance Materials |

Each hydrophilic layer formulation shown in TABLE I was coated onto a sample of one of Type 1, 2, or 3 Support using a re-wound coating bar and dried at 70° C. for 2 minutes and cooled to 20-27° C. to provide a hydrophilic layer on the outer aluminum oxide layer, followed by drying to provide a hydrophilic layer coverage of 0.03 g/m² in a Type 1, 2, or 3 Substrate.

Preparation of Negative-Working On-Press Developable Precursors

A coating formulation of a negative-working, on-press developable infrared radiation-sensitive imageable layer was prepared using the components and amounts shown in the following TABLES III and IV, using a bar coater to provide a dry coating weight of 0.9 g/m² after drying at 50° C. for 60 seconds.

The raw materials that are identified below in TABLES III and IV can be obtained from one or more commercial sources of chemicals or were prepared using known synthetic methods and starting materials.

TABLE III

| Component | Amount (grams) |
|---|---|
| Polymer dispersion | 0.675 |
| Hydroxypropyl methyl cellulose | 0.400 |
| Monomer 1 | 0.333 |
| Monomer 2 | 0.167 |
| IR Dye 1 | 0.020 |
| Leuco Dye 1 | 0.023 |
| BYK ® 302 surfactant | 0.045 |
| Iodonium salt | 0.06 |
| 1-Propanol | 2.6 |
| 2-Butanone | 3.5 |
| 1-Methoxy-2-propanol | 0.92 |
| δ-Butyrolactone | 0.10 |
| Water | 1.16 |

TABLE IV

| | |
|---|---|
| Polymer dispersion | The polymer dispersion was prepared according to Example 10 of EP Publication 1,765,593, the disclosure of which is incorporated herein by reference, used as a 23.5 weight % polymer in n-propanol/water mixture at an 80:20 weight ratio |
| Hydroxypropyl methyl cellulose | 5 weight % hydroxypropyl methyl cellulose polymer in water; the polymer was 30% methoxylated, 10% hydroxyl propoxylated and had a viscosity of 5 mPa-sec in a 2 weight % aqueous solution at 20° C. |
| Monomer 1 | Urethane acrylate prepared by reacting DESMODUR ® N100 (from Bayer Corp., Milford, CT) with hydroxyethyl acrylate and pentaerythritol triacrylate at approximately 1:1.5:1.5 molar ratio (40 weight % in 2-butanone) |

Leuco dye 1

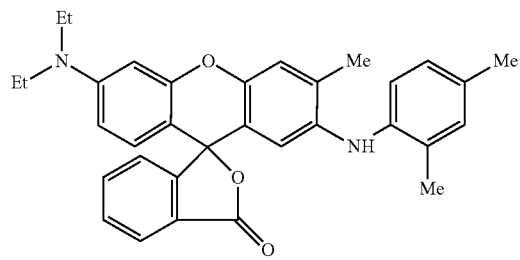 [SMILES: CCN(CC)c1ccc2c(c1)Oc1cc(C)c(Nc3ccc(C)cc3C)cc1C21OC(=O)c2ccccc21]

TABLE IV-continued

| | |
|---|---|
| BYK ® 302 surfactant | Surfactant from Byk Chemie, used as a 25 weight % solution in 1-methoxy-2-propanol |
| Iodonium salt | Bis(t-butylphenyl) iodonium tetraphenyl borate; sensitive to infrared radiation |
| Monomer 2 | Ethoxylated (10 EO) bisphenol A acrylate, 40 weight % in 2-butanone |

IR dye 1

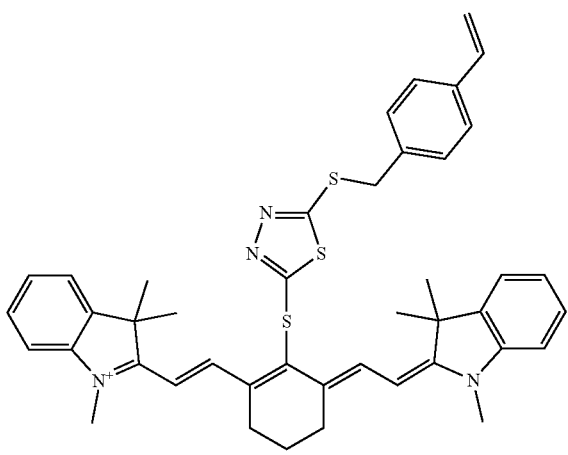 [SMILES: C=Cc1ccc(CSc2nnc(SC3=C(/C=C/C4=[N+](C)c5ccccc5C4(C)C)CCC/C3=C\C=C3\N(C)c4ccccc4C3(C)C)s2)cc1]

The Invention and Comparative Examples were prepared according to the general processes described above and after applying the hydrophilic layer formulation to the grained, etched, and two- or three-times anodized aluminum-containing support, the infrared radiation-sensitive image recording layer was prepared as described above. The following TABLE V identifies each of these Examples.

TABLE V

| | Type Substrate | Hydrophilic Layer |
|---|---|---|
| Invention Example 1 | 1 | HL-1 |
| Invention Example 2 | 1 | HL-2 |
| Invention Example 3 | 2 | HL-2 |
| Invention Example 4 | 3 | HL-2 |
| Invention Example 5 | 1 | HL-3 |
| Invention Example 6 | 1 | HL-4 |
| Invention Example 7 | 1 | HL-5 |
| Comparative Example 1 | 1 | HL-6 |
| Comparative Example 2 | 1 | HL-7 |
| Comparative Example 3 | 1 | HL-8 |
| Comparative Example 4 | 1 | HL-9 |
| Comparative Example 5 | 1 | HL-10 |
| Comparative Example 6 | 1 | HL-11 |
| Comparative Example 7 | 1 | HL-12 |
| Comparative Example 8 | 1 | HL-13 |

Each Invention and Comparative precursor described above was evaluated with respect to press life, on-press developability, ink-water balance (restart toning or RST test), and shelf life using the following test methods and the results of these evaluations are shown in TABLE VI below.

On-Press Developability (DOP):

To evaluate on-press developability, each lithographic printing plate precursor (both inventive and comparative) was imagewise exposed using a Trendsetter 800 III Quantum (available from Eastman Kodak Company) in segments at different energies of between 50 mJ/cm$^2$ and 300 mJ/cm$^2$ and then mounted on a Heidelberg Speedmaster SM 74 printing press (available from Heidelberg) without any development process in between. In other words, each imaged precursor was developed on-press using this printing press that was operated with Varn Supreme 6038+Par fountain solution and OF Kodak Kreide black lithographic printing ink (Jänecke+Schneemann Druckfarben GmbH). The on-press developability printing test was performed for up to 1,000 impressions with each resulting lithographic printing plate. On the first 10 revolutions, the printing press was operated only with fountain solution, and afterwards lithographic ink was supplied to the lithographic printing plates and printing paper was fed to the machine. During the on-press development process, the non-exposed regions of the infrared radiation-sensitive image recording layer initially transferred lithographic ink to printed sheets. On-press developability was evaluated by counting the number of printed paper sheets needed to obtain a clean background and was given one of the following qualitative values based on the number of printed paper sheets:

(++) development finished with 5 or fewer sheets of paper;

(+) development finished with more than 5 sheets, but 10 or fewer sheets of paper;

(0) development finished with more than 10 sheets, but 15 or fewer sheets of paper;

(−) development finished with more than 15 sheets, but 30 or fewer sheets of paper; and (—) development finished with more than 30 sheets, but 50 or fewer sheets of paper.

Shelf Life:

To evaluate shelf life, the same imagewise exposure conditions as described above for the on-press developability test were used, except that, before imagewise exposure, each lithographic printing plate precursor (both inventive and comparative precursors) was subjected to an accelerated ageing by storing each precursor after coating for 5 days at 40° C. and 80% relative humidity. Each precursor was then imaged and used in printing on the printing press as described above for the on-press developability printing test and with the following same scoring:

(++) development finished with 5 or fewer sheets of paper;

(+) development finished with more than 5 sheets, but 10 or fewer sheets of paper;

(0) development finished with more than 10 sheets, but 15 or fewer sheets of paper;

(−) development finished with more than 15 sheets, but 30 or fewer sheets of paper; and (—) development finished with more than 30 sheets, but 50 or fewer sheets of paper.

Press Life:

To evaluate press life, each lithographic printing plate precursor (both inventive and comparative) was imagewise exposed using a Trendsetter 800 III Quantum (available from Eastman Kodak Company) at 120 mJ/cm² and then mounted on a Heidelberg Speedmaster SM 74 printing press (available from Heidelberg) without any development process in between. In other words, each imaged precursor was developed on-press using this printing press that was operated with Varn Supreme 6038+Par fountain solution and OF Kodak Kreide black lithographic printing ink (Jänecke+ Schneemann Druckfarben GmbH). The press life printing test was performed for up to 150,000 impressions with each resulting lithographic printing plate. With ongoing printing, the lithographic printing plates were gradually abraded. The press life for each lithographic printing plate is defined as the number of printed paper sheets achieved before the tonal value of the printed paper sheets in a 50% FM20 screen had been reduced to 70% or less of the tonal value obtained on the 1000$^{th}$ sheet. For the measurement of tonal values, a Techkon Spectro Dens spectral densitometer was used, and the results were scored as follows:

(++) equal to or more than 80,000 sheets;

(+) equal to or more than 60,000 sheets, but less than 80,000 sheets;

(0) equal to or more than 40,000 sheets, but less than 60,000 sheets;

(−) equal to or more than 20,000 sheets, but less than 40,000 sheets; and (—) less than 20,000 sheets.

Restart Toning (RST):

To evaluate restart toning, the same exposure conditions as described for the press life test were applied. A sample of each imagewise exposed lithographic printing plate precursor (both inventive and comparative) was mounted onto a SpeedMaster SX 52 printing press and developed on press using Böttcher fount S-3021 fountain solution and OF Kodak Kreide black lithographic printing ink (Jänecke+ Schneemann Druckfarben GmbH). After 3,000 impressions, the printing press was stopped without post-dampening. After 15 minutes, the restart toning (RST) was tested without pre-dampening of each lithographic printing plate. For the restart toning test, the water content was operated close to the smearing limit to enhance the differentiation in restart toning. The printed sheets were evaluated by using a large format scanner and the subsequent analysis of the brightness in specific areas. A non-image area and a 20 μm checkerboard were analyzed. When the brightness in the specified area reached the maximum value, the plate was rated as clean and the results were scored as follows:

(++) less than 20 sheets;

(+) equal to or more than 20 sheets, but less than 30 sheets;

(0) equal to or more than 30 sheets, but less than 40 sheets;

(−) equal or more than 40 sheets, but less than 50 sheets; and (—) equal or more than 50 sheets.

The following TABLE VI shows the results for the DOP, shelf life, press life, and RST tests for each inventive and comparative example, with the evaluations identified above.

TABLE VI

|  | DOP | Shelf Life | Press Life | RST |
| --- | --- | --- | --- | --- |
| Invention Example 1 | (++) | (+) | (++) | (+) |
| Invention Example 2 | (++) | (+) | (++) | (++) |
| Invention Example 3 | (+) | (+) | (−) | (++) |
| Invention Example 4 | (++) | (+) | (+) | (+) |
| Invention Example 5 | (++) | (+) | (+) | (+) |
| Invention Example 6 | (+) | (+) | (++) | (+) |
| Invention Example 7 | (+) | (+) | (++) | (+) |
| Comparative example 1 | (++) | (0) | (+) | (—) |
| Comparative example 2 | (+) | (—) | (+) | (−) |
| Comparative example 3 | (++) | (—) | (0) | (−) |
| Comparative example 4 | (+) | (—) | (—) | (++) |
| Comparative example 5 | (+) | (0) | (−) | (—) |
| Comparative Example 6 | (+) | (0) | (+) | (−) |
| Comparative Example 7 | (+) | (+) | (++) | (−) |
| Comparative Example 8 | (++) | (+) | (−) | (+) |

The results show that it is essential to use the (1) compound and the (2) one or more hydrophilic polymers together to achieve overall improved results in several important features for on-press developable lithographic printing plate precursors, such as fast DOP, good shelf life, high length of run, and good restart toning behavior. The best embodiments of the present invention provided improvements in multiple features without other features being undesirably diminished.

The invention has been described in detail with particular reference to certain preferred embodiments thereof, but it will be understood that variations and modifications can be effected within the spirit and scope of the invention.

The invention claimed is:

1. A lithographic printing plate precursor comprising:
   a substrate having a surface, and
   an on-press developable radiation-sensitive imageable layer disposed over the surface of the substrate,
   wherein the substrate comprises:
   an aluminum-containing plate having a grained and etched surface;
   an inner aluminum oxide layer disposed on the grained and etched surface, the inner aluminum oxide layer having an average dry thickness ($T_i$) of at least 300 nm and up to and including 3,000 nm, and comprising: a multiplicity of inner micropores having an average inner micropore diameter ($D_i$) of less than or equal to 100 nm;
   an outer aluminum oxide layer disposed over the inner aluminum oxide layer, the outer aluminum, oxide layer comprising a multiplicity of outer micropores having an average outer' micropore diameter ($D_o$) of at least 15 nm and up to and including 30 nm, and having an average dry thickness ($T_1$) of at least 30 nm and up to and including 650 nm; and
   a hydrophilic layer disposed on the outer aluminum oxide layer at a dry coverage of at least 0.0002 g/m² and up to and including 0.1 g/m², and which hydrophilic layer comprises:
   (1) a compound having one or more ethylemcally unsaturated polymenzable groups, one or more —OM groups at least one of which is connected directly to a phosphorus atom, and a molecular weight of less than 2000 Daltons/mole, wherein M represents a hydrogen, sodium, potassium, or aluminum atom; and (2) one or more hydrophilic polymers, each comprising at least (a) recurring units comprising an amide group, and (b) recurring units comprising an —OM' group that is directly connected to a phosphorus atom, wherein M' represents a hydrogen, sodium, potassium, or aluminum atom.

2. The lithographic printing plate precursor of claim 1, wherein the outer aluminum oxide layer has a micropore density ($C_o$) of at least 500 micropores/$\mu m^2$ and up to and including 3,000 micropores $\mu m^{2}$, and has a porosity ($P_o$) greater than or equal to 0.3 and less than or equal to 0.8 wherein $P_o$ is defined as $3.14(C_o)(D_o^2)/4,000,000$.

3. The lithographic printing plate precursor of claim 1, wherein the outer aluminum oxide layer has an average dry thickness ($T_o$) of at least 130 nm, and the outer aluminum oxide layer is disposed directly on the inner aluminum oxide layer; the average dry thickness of the inner aluminum oxide layer ($T_i$) is at least 650 nm, and the average inner micropore diameter ($D_i$) is less than or equal to 15 nm and less than the average outer micropore diameter ($D_o$).

4. The lithographic printing plate precursor of claim 1, wherein the substrate further comprises a middle aluminum oxide layer disposed between the inner aluminum oxide layer and the outer aluminum oxide layer, wherein the middle aluminum oxide layer has an average dry thickness ($T_m$) of at least 60 nm and up to and including 300 nm, and comprises a multiplicity of middle micropores having an average middle micropore diameter ($DF_m$) of at least 20 nm and up to and including 60 nm, wherein $D_m$ is greater than $D_o$ that is greater than $D_i$, and the average dry thickness of the outer aluminum oxide layer ($T_o$) is less than 150 nm.

5. The lithographic printing plate precursor of claim 1, wherein the outer aluminum oxide layer is disposed directly on the inner aluminum oxide layer, and the average micropore diameter ($D_i$) of the inner aluminum oxide layer is at least 20 nm and is greater than the average micropore diameter ($D_o$) of the outer aluminum oxide layer.

6. The lithographic printing plate precursor of claim 1, wherein at least one ethylenically unsaturated polymerizable group in (1) compound is connected to the phosphorus atom to which the —OM group is connected, wherein the spacer group is represented by the formula —(—$CH_2CH_2O$—)$_p$— wherein the subscript p is an integer of at least 1 and up to and including 10.

7. The lithographic printing plate precursor of claim 1, wherein the (1) compound is present in an amount of at least 10 weight % and up to and including 80 weight %, based on the total weight (solids) of the hydrophilic layer, or the weight ratio of one or more (1) compounds to the (s) one or more hydrophilic polymers in the hydrophilic layer is from 1:4 to 4:1.

8. The lithographic printing plate precursor of claim 1, wherein the (1) compound is represented by the following Structure (I)

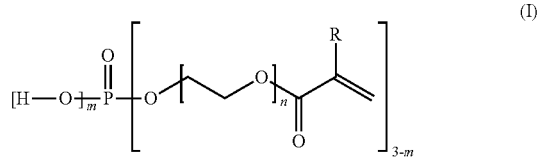

wherein the subscript m is 1 or 2, the subscript n is an integer of at least 1 and up to and including 10, and R is a hydrogen atom or a substituted or unsubstituted methyl group.

9. The lithographic printing plate precursor of claim 1, wherein the (a) recurring units are present in the (2) one or more hydrophilic polymers in an amount of at least 60 mol % and up to and including 97 mol %, and the (b) recurring units are present in the (2) one or more hydrophilic polymers in an amount of at least 3 mol % and up to and including 40 mol %, all based on the total number (or moles) of recurring units in the (2) one or more hydrophilic polymers.

10. The lithographic printing plate precursor of claim 1, wherein the on-press developable radiation-sensitive imageable layer is negative-working and comprises:
(a) one or more free radically polymerizable components;
(b) an initiator composition that provides free radicals upon exposure of the radiation-sensitive imageable layer to imaging radiation;
(c) one or more radiation absorbers; and optionally,
(d) a polymeric binder that is different from all of (a), (b), and (c).

11. The lithographic printing plate precursor of claim 1, wherein each of the one or more hydrophilic polymers in the hydrophilic layer comprises the (a) recurring units that are derived at least from one or more of methacrylamide and acrylamide, or the (b) recurring units that are derived from at least vinyl phosphonic acid.

12. The lithographic printing plate precursor of claim 1, wherein the on-press developable radiation-sensitive imageable layer is negative-working and sensitive to infrared radiation, and comprises one or more infrared radiation absorbers.

13. The lithographic printing plate precursor of claim 10, wherein the on-press developable negative-working radiation-sensitive layer further comprises the (d) polymeric binder that is in particulate form.

14. A method for providing a lithographic printing plate, comprising:
imagewise exposing the lithographic printing plate precursor of claim 1 to imaging radiation to form an imagewise exposed imageable layer having exposed regions and non-exposed regions, and
removing the non-exposed regions from the imagewise exposed imageable layer, on press, to form a lithographic printing plate.

15. The method of claim 14, wherein the lithographic printing plate precursor comprises one or more infrared radiation absorbers, and the imagewise exposing is carried out using infrared radiation.

16. A method for preparing a lithographic printing plate precursor, comprising, in order:
providing an aluminum-containing plate having an electrochemically or mechanically grained and etched surface;
subjecting the aluminum-containing plate to a first anodizing process to form an outer aluminum oxide layer on the electrochemically or mechanically grained and etched surface, the outer aluminum oxide layer comprising a multiplicity of outer micropores having an average outer micropore diameter ($D_o$) of at least 15 nm and up to and including 30 nm, and having an average dry thickness ($T_o$) of at least 30 nm and up to and including 650 nm;
rinsing the outer aluminum oxide layer;
subjecting the aluminum-containing plate to a second anodizing process to form an inner aluminum oxide layer underneath the outer aluminum oxide layer, the inner aluminum oxide layer having an average dry thickness ($T_i$) of at least nm and up to and including 3,000 nm; and comprising a multiplicity of inner micropores having an average inner micropore diameter ($D_i$) of less than or equal to 100 nm;

rinsing the outer aluminum oxide layer and the inner aluminum oxide layer;

forming an on-press developable radiation-sensitive imageable layer over the outer aluminum oxide layer; and after rinsing the outer aluminum oxide layer and the inner aluminum oxide layer, and before forming the on-press developable radiation-sensitive imageable layer over the outer aluminum oxide layer, providing a hydrophilic layer over the outer aluminum oxide layer, the hydrophilic layer comprising:

(1) a compound having one or more ethylenically unsaturated polymerizable groups, one or more —OM groups at least one of which is connected directly to a phosphorus atom, and a molecular weight of less than 2000 Daltons/mole, wherein M represents a hydrogen, sodium potassium, or aluminum atom, and (2) one or more hydrophilic polymers, each comprising at least (a) recurring units comprising an amide unit, and (b) recurring units comprising an —OM' group that is directly connected to a phosphorus atom, wherein M' represents a hydrogen, sodium, potassium, or aluminum atom, and which hydrophilic layer is disposed over the outer aluminum oxide layer at a dry coverage of at least 0.0002 g/m² and up to and including 0.1 g/m².

17. The method of claim 16, wherein the on-press developable radiation-sensitive layer is infrared radiation-sensitive and negative-working and comprises:

(a) one or more free radically polymerizable components;

(b) an initiator composition that provides free radicals upon exposure of the radiation-sensitive imageable layer to imaging radiation;

(c) one or more radiation absorbers; and optionally, (d) a polymeric binder that is different from all of (a), (b), and (c).

18. The method of claim 16, wherein the (2) one or more hydrophilic polymers in the hydrophilic layer comprises the (a) recurring units that are derived at least from one or more of methacrylamide and acrylamide, and the (b) recurring units are derived from at least vinyl phosphonic acid, and the (a) recurring units are present in the (2) one or more hydrophilic polymers in an amount of at least 60 mol % and up to and including 97 mol %, and the (b) recurring units are present in the (2) one or more hydrophilic polymers in an amount of at least 3 mol % and up to and including 40 mol %, all based on the total number (or moles) of recurring units in the (2) one or more hydrophilic polymers.

19. The method of claim 16, wherein the (1) compound is represented by the following Structure (I)

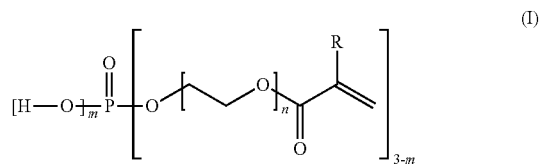

wherein the subscript m is 1 or 2, the subscript n is an integer of at least 1 and up to and including 10, and R is a hydrogen atom or a substituted or unsubstituted methyl group.

20. The method of claim 1, wherein the weight ratio of one or more (1) compounds to the (2) one or more hydrophilic polymers in the hydrophilic layer is from 1:4 to 4:1.

* * * * *